(12) United States Patent
Ishikawa et al.

(10) Patent No.: US 9,065,383 B2
(45) Date of Patent: Jun. 23, 2015

(54) OSCILLATION CIRCUIT, SEMICONDUCTOR INTEGRATED CIRCUIT DEVICE, VIBRATING DEVICE, ELECTRONIC APPARATUS, AND MOVING OBJECT

(71) Applicant: Seiko Epson Corporation, Tokyo (JP)

(72) Inventors: Masayuki Ishikawa, Suwa (JP);
Takehiro Yamamoto, Suwa (JP);
Yosuke Itasaka, Chino (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 14/033,746

(22) Filed: Sep. 23, 2013

(65) Prior Publication Data
US 2014/0091868 A1    Apr. 3, 2014

(30) Foreign Application Priority Data

Sep. 28, 2012  (JP) .................................. 2012-216376

(51) Int. Cl.
*H03B 5/36* (2006.01)
*H03B 9/14* (2006.01)

(52) U.S. Cl.
CPC ............... *H03B 9/145* (2013.01); *H03B 5/368* (2013.01)

(58) Field of Classification Search
USPC ................................. 331/177 V, 158, 107 DP
See application file for complete search history.

(56) References Cited

U.S. PATENT DOCUMENTS

| | | | |
|---|---|---|---|
| 6,040,744 A | 3/2000 | Sakurai et al. | |
| 6,239,662 B1 * | 5/2001 | Fukayama et al. | 331/66 |
| 6,559,730 B1 | 5/2003 | Marvin et al. | |
| 6,788,159 B2 | 9/2004 | Takahashi et al. | |
| 7,212,076 B1 | 5/2007 | Taheri et | |
| 7,986,194 B2 | 7/2011 | Kiyohara et al. | |
| 2002/0180544 A1 | 12/2002 | Fukayama et al. | |
| 2006/0208816 A1 | 9/2006 | Ohshima et al. | |
| 2008/0309424 A1 | 12/2008 | Shen et al. | |
| 2009/0039970 A1 | 2/2009 | Shen et al. | |
| 2014/0091868 A1 | 4/2014 | Ishikawa et al. | |
| 2014/0091872 A1 | 4/2014 | Itasaka | |

FOREIGN PATENT DOCUMENTS

| | | |
|---|---|---|
| JP | 09-102714 A | 4/1997 |
| JP | 11-88052 | 3/1999 |
| JP | 2007-019565 A | 1/2007 |
| WO | WO-2005-046046 A1 | 5/2005 |

* cited by examiner

*Primary Examiner* — Joseph Chang
(74) *Attorney, Agent, or Firm* — Harness, Dickey & Pierce, P.L.C.

(57) ABSTRACT

An oscillation circuit includes a first variable capacitance part which includes a first variable capacitance element whose capacitance is controlled on the basis of a potential difference between a first control voltage and a first reference voltage, and is connected to the oscillation circuit, a second variable capacitance part which includes a second variable capacitance element whose capacitance is controlled on the basis of a potential difference between a first control voltage and a second reference voltage, and is connected to the oscillation circuit. If composite capacitance in the first variable capacitance part excluding the first variable capacitance element is first composite capacitance, composite capacitance in the second variable capacitance part excluding the second variable capacitance element is second composite capacitance, and if the second composite capacitance is greater than the first composite capacitance, the second variable capacitance element having capacitance greater than the first variable capacitance element is used.

13 Claims, 16 Drawing Sheets

OSCILLATION CIRCUIT, SEMICONDUCTOR INTEGRATED CIRCUIT DEVICE, VIBRATING DEVICE, ELECTRONIC APPARATUS, AND MOVING OBJECT

BACKGROUND

1. Technical Field

The present invention relates to an oscillation circuit, a semiconductor integrated circuit device, a vibrating device, an electronic apparatus, a moving object, and the like.

2. Related Art

In order to make a frequency of an oscillation circuit variable, a method in which a voltage is applied to a variable capacitive element arranged in the oscillation circuit to change capacitance is known. An oscillator which controls a frequency with voltage is generally called a voltage controlled X'tal oscillator (VCXO). As an oscillator in which a frequency deviation is suppressed with respect to temperature using this principle, a temperature compensated X'tal oscillator (TCXO) is known.

In a discrete oscillator, although a variable capacitive element having a large change in capacitance is selected to constitute a circuit, when implementing an oscillation circuit in the form of an integrated circuit, the characteristics of usable variable capacitive elements are limited. That is, if an oscillation circuit is implemented in the form of an integrated circuit, in general, a variable capacitive element has a smaller change in capacitance than a discrete variable capacitive element. This is because a dedicated process is required in order to obtain a large change in capacitance.

In recent years, reduction in size of a crystal oscillator is demanded, and implementation of an oscillation circuit in the form of an integrated circuit is in progress. However, when an integrated circuit is used, the variable amount of a usable variable capacitive element is limited, and thus there is a problem in that a necessary frequency variable width or linearity is not obtained. In other words, there is a problem in that it is not possible to appropriately obtain the sensitivity characteristic of the variable capacitance element.

In JP-A-2007-19565, a single control voltage which is applied to two variable capacitive elements is divided halfway by two level shift circuits, given a potential difference, and then applied to the variable capacitive elements. At this time, a configuration is made such that the C-V characteristic of one variable capacitive element is linear in a region lower than the center voltage of the control voltage, and the C-V characteristic of the other variable capacitive element is linear in a region higher than the center voltage of the control voltage. For this reason, it is possible to allow the control voltage to fluctuate in a wider range than the related art while securing linearity and to obtain a necessary frequency variable width.

However, in JP-A-2007-19565, a plurality of level shift circuits are required for each control voltage. For example, in the TCXO, a plurality of kinds of control voltages are used in order to control frequency. At this time, level shift circuits corresponding to the number obtained by multiplying the number of kinds are required. Accordingly, when the method disclosed in JP-A-2007-19565 is applied to the TCXO, circuit scale and power consumption tend to increase.

SUMMARY

An advantage of some aspects of the invention is to provide an oscillation circuit, a semiconductor integrated circuit device, a vibrating device, an electronic apparatus, a moving object, and the like capable of obtaining a sensitivity characteristic of an appropriate variable capacitance element while suppressing an increase in circuit scale and power consumption and expanding a variable width of a variable capacitance element.

The invention can be implemented as the following forms or application examples.

Application Example 1

This application example is directed to an oscillation circuit which is connected to an amplification circuit and oscillates an resonator element to output an oscillation signal, including a first variable capacitance part which includes a first variable capacitance element whose capacitance is controlled on the basis of a potential difference between a first control voltage and a first reference voltage, and is connected to an input side of the amplification circuit, and a second variable capacitance part which includes a second variable capacitance element whose capacitance is controlled on the basis of a potential difference between a first control voltage and a second reference voltage, and is connected to an output side of the amplification circuit. If composite capacitance in the first variable capacitance part excluding the first variable capacitance element is first composite capacitance, and composite capacitance in the second variable capacitance part excluding the second variable capacitance element is second composite capacitance, if the second composite capacitance is greater than the first composite capacitance, when comparing with capacitance based on a reference potential difference, the second variable capacitance element having capacitance greater than the first variable capacitance element is used, and if the first composite capacitance is greater than the second composite capacitance, when comparing with capacitance based on the reference potential difference, the first variable capacitance element having capacitance greater than the second variable capacitance element is used.

The oscillation circuit according to this application example is electrically connected to the amplification circuit and the resonator element, and oscillates the resonator element to output the oscillation signal. At this time, as the amplification circuit, a bipolar transistor, a filed effect transistor (FET), a metal oxide semiconductor field effect transistor (MOSFET), or the like may be used. As the resonator element, for example, a surface acoustic wave (SAW) resonator, an AT cut crystal vibrator, an SC cut crystal vibrator, a tuning fork crystal vibrator, other piezoelectric vibrators, a micro electro mechanical systems (MEMS) vibrator, or the like may be used.

The oscillation circuit according to this application example includes the first variable capacitance part and the second variable capacitance part whose capacitance can be varied. The first variable capacitance part includes at least the first variable capacitance element whose capacitance is controlled on the basis of the potential difference between the first control voltage and the first reference voltage. The second variable capacitance part includes at least the second variable capacitance element whose capacitance is controlled on the basis of the potential difference between the first control voltage and the second reference voltage.

The first variable capacitance part and the second variable capacitance part are respectively connected to the input side and the output side of the resonator element. That is, the first variable capacitance part and the second variable capacitance part are connected to an oscillation loop, and the frequency of the oscillation signal changes with change in capacitance of the first variable capacitance part and the second variable capacitance part. In regard to the input side and the output side, two terminals (connection parts to the oscillation circuit) of the resonator element are distinguished so as to belong to different sides, the side on which the oscillation signal is output is referred to as the output side, and the opposite side is referred to as the input side.

At this time, although the first control voltage is common to the first variable capacitance element and the second variable capacitance element, the first reference voltage and the second reference voltage are different. That is, in a case in which the oscillation circuit according to this application example is used, different potential differences are respectively given to the first variable capacitance element and the second variable capacitance element. For this reason, it is possible to expand the variable width after combination of the first variable capacitance element and the second variable capacitance element. At this time, since no level shift circuit is required, it is possible to suppress an increase in circuit scale and power consumption.

In the oscillation circuit according to this application example, a wide variable width and linearity are demanded. That is, in a variable range of the first control voltage, as constant a sensitivity characteristic as possible is demanded. For this reason, it is necessary to appropriately select the first variable capacitance element and the second variable capacitance element on the basis of capacitance with the reference potential difference.

The reference potential difference means a predetermined potential difference (for example, 0 V) which is given after a predetermined terminal (for example, a back-gate terminal or when the polarity of a varactor is inverted, a gate terminal) of a variable capacitance element reaches a predetermined voltage (for example, a ground potential). That is, the potential difference is given so as to compare the varying capacitance of the first variable capacitance element with the fluctuating capacitance of the second variable capacitance element under the same condition.

In the oscillation circuit according to this application example, if the second composite capacitance is greater than the first composite capacitance, when comparing with capacitance based on the reference potential difference, the second variable capacitance element having capacitance greater than the first variable capacitance element is used. Conversely, if the first composite capacitance is greater than the second composite capacitance, when comparing with capacitance based on the reference potential difference, the first variable capacitance element having capacitance greater than the second variable capacitance element is used.

The first composite capacitance is composite capacitance in the first variable capacitance part excluding the first variable capacitance element. The second composite capacitance is composite capacitance in the second variable capacitance part excluding the second variable capacitance element. That is, the magnitude of capacitance with the reference potential difference between the first variable capacitance element and the second variable capacitance element conforms to the magnitude of the first composite capacitance and the second composite capacitance. With this, it is possible to make the amount of change of the first variable capacitance part with respect to change in first control voltage conform to the amount of change in the second variable capacitance part, thereby obtaining excellent linearity as the entire variable range and an appropriate sensitivity characteristic. In this way, in the oscillation circuit according to this application example, it is possible to obtain an appropriate sensitivity characteristic of a variable capacitance element while suppressing an increase in circuit scale and power consumption and expanding a variable width of a variable capacitance element.

A variable capacitance element of the oscillation circuit according to this application example is, for example, a metal oxide semiconductor (MOS) variable capacitance element. The MOS variable capacitance element is a variable capacitance element (hereinafter, referred to as a varactor) having a structure of a metal oxide semiconductor.

Application Example 2

The oscillation circuit according to the application example described above may be configured such that, if the second composite capacitance is greater than the first composite capacitance, when comparing with capacitance based on the reference potential difference, the second variable capacitance element having capacitance equal to or smaller than 1.5 times greater than the first variable capacitance element is used, and if the first composite capacitance is greater than the second composite capacitance, when comparing with capacitance based on the reference potential difference, the first variable capacitance element having capacitance equal to or greater than 1.5 times greater than the second variable capacitance element is used.

With the oscillation circuit according to this application example, it is possible to set the upper limit and the lower limit of capacitance of one of the first variable capacitance element and the second variable capacitance element using capacitance of the other variable capacitance element. For this reason, it is possible to select the first variable capacitance element and the second variable capacitance element more easily and appropriately. The term "capacitance" used herein means capacitance based on the reference potential difference.

As described above, the magnitude of capacitance with the reference potential difference between the first variable capacitance element and the second variable capacitance element conforms to the magnitude of the first composite capacitance and the second composite capacitance. At this time, it is possible to make the amount of change of the first variable capacitance part with respect to the first control voltage conform to the amount of change in the second variable capacitance part, thereby obtaining excellent linearity and an appropriate sensitivity characteristic.

In the oscillation circuit, there is no significant difference between the first composite capacitance and the second composite capacitance. In general, it can be said that one of the first composite capacitance and the second composite capacitance is equal to or smaller than 1.5 times greater than the other composite capacitance. If this is taken into consideration, when selecting capacitance with the reference potential difference between the first variable capacitance element and the second variable capacitance element, capacitance may be equal to or smaller than 1.5 times greater than the other composite capacitance. The upper limit is provided, thereby expecting that effective design is possible, and an appropriate sensitivity characteristic is obtained in a shorter time.

Application Example 3

The oscillation circuit according to the application example described above may be configured such that at least one of the first variable capacitance part and the second variable capacitance part includes a variable capacitance element whose capacitance is controlled by a control voltage different from the first control voltage.

With the oscillation circuit according to this application example, at least one of the first variable capacitance part and the second variable capacitance part includes a variable capacitance element separated from the first variable capacitance element and the second variable capacitance element. That is, a variable capacitance element whose capacitance is controlled by a control voltage different from the first control voltage is included in at least one of the first variable capacitance part and the second variable capacitance part.

For example, when the first variable capacitance element and the second variable capacitance element use the first control voltage for temperature compensation, at least one of the first variable capacitance part and the second variable capacitance part may include a variable capacitance element which uses a different control voltage for external control.

In this way, when the oscillation circuit includes a plurality of kinds of variable capacitance elements, linearity tends to be particularly deteriorated. In the related art, since capacitance of the first variable capacitance element and capacitance of the second variable capacitance element tend to be the same, there is a problem in that it is not possible to appropriately obtain a sensitivity characteristic of a variable capacitance element. With the oscillation circuit according to this application example, the magnitude of capacitance with the reference potential difference between the first variable capacitance element and the second variable capacitance element conforms to the magnitude of the first composite capacitance and second composite capacitance, thereby obtaining excellent linearity and an appropriate sensitivity characteristic.

Application Example 4

This application example is directed to a semiconductor integrated circuit device including the oscillation circuit according to the application example described above.

Application Example 5

The semiconductor integrated circuit device according to the application example described above may be configured to further include the amplification circuit.

With the semiconductor integrated circuit device according to these application examples, implementation in the form of an IC including the oscillation circuit is made, and an appropriate sensitivity characteristic of a variable capacitance element is obtained while suppressing an increase in circuit scale and power consumption and expanding a variable width of the variable capacitance element. Since the oscillation circuit is an electronic component in the form of a single chip, for example, the oscillation circuit may be used in combination with other electronic components on a substrate, thereby increasing the degree of freedom for design and achieving user-friendliness.

The semiconductor integrated circuit device may be implemented in the form of an IC including an amplification circuit. At this time, for example, a vibrating device can be formed only through connection to the resonator element, thereby achieving user-friendliness.

Application Example 6

This application example is directed to a vibrating device including the oscillation circuit according to the application example described above, the amplification circuit, and the resonator element.

The vibrating device according to this application example includes the oscillation circuit, thereby obtaining an appropriate sensitivity characteristic of a variable capacitance element while suppressing an increase in circuit scale and power consumption and expanding a variable width of the variable capacitance element. Since the amplification circuit and the resonator element are also included, direct use as a vibrating device is possible, and user-friendliness is achieved.

The vibrating device may be, for example, an oscillator which outputs an oscillation signal from the oscillation circuit. The vibrating device may be a sensor (for example, an acceleration sensor, an angular velocity sensor, or the like) which includes a circuit configured to detect a frequency or the like of an oscillation signal fluctuating depending on a given physical quantity (for example, acceleration, angular velocity, or the like), and outputs a detection signal changing according to the given physical quantity.

Application Example 7

This application example is directed to an electronic apparatus including the oscillation circuit according to the application example described above.

Application Example 8

This application example is directed to a moving object including the oscillation circuit according to the application example described above.

The electronic apparatus and the moving object according to these application examples include the oscillation circuit, and obtain a sensitivity characteristic of an appropriate variable capacitance element while suppressing an increase in circuit scale and power consumption and expanding a variable width of a variable capacitance element. For this reason, it is possible to obtain a necessary frequency variable width, and to realize an electronic apparatus and a moving object having user-friendliness.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
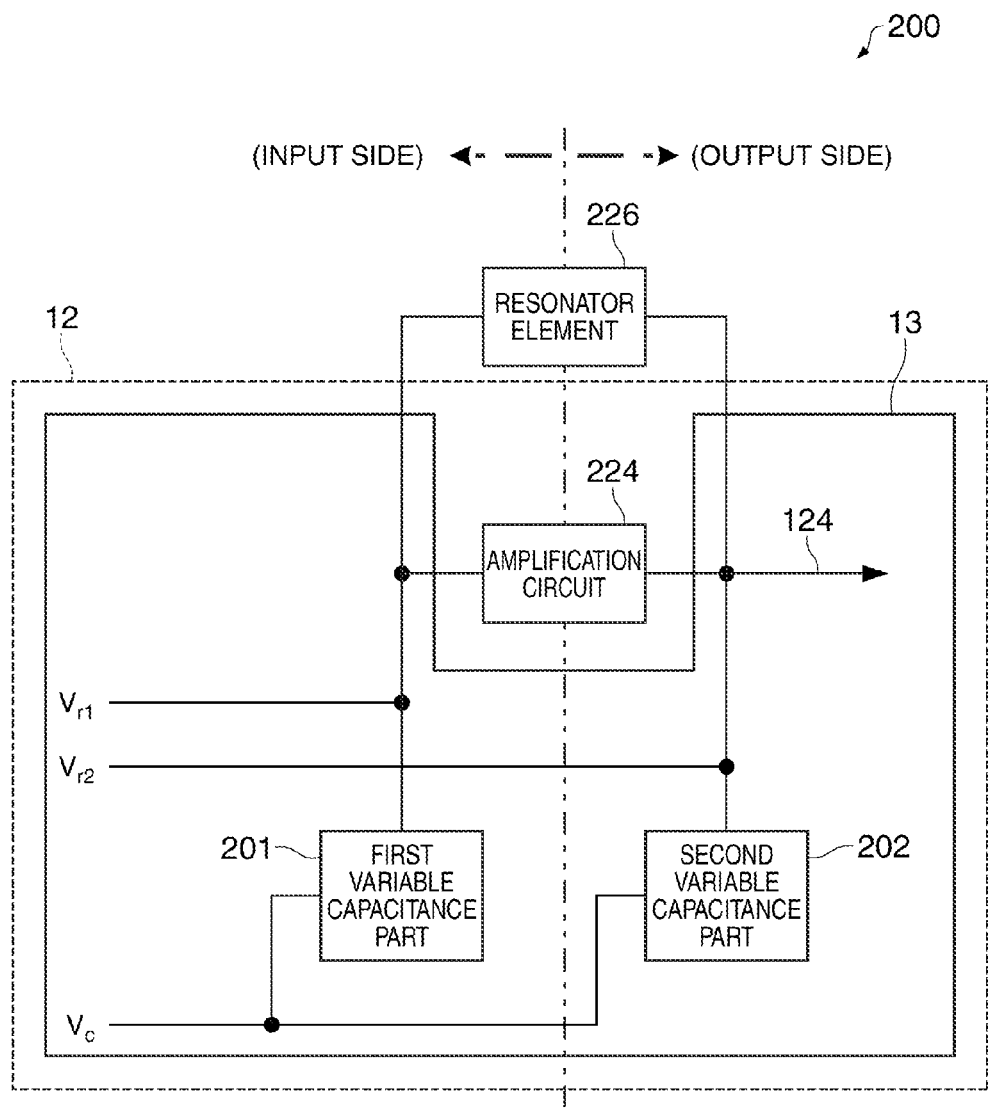
FIG. 1 is a block diagram of a vibrating device including an oscillation circuit of this embodiment.

Hereinafter, a preferred embodiment of the invention will be described in detail referring to the drawings. The following embodiments are not intended to unduly limit the content of the invention described in the appended claims. It is not always true that the entire configuration described below is the essential constituent requirement of the invention.

1. Oscillation Circuit

1.1. Overall Block Diagram

FIG. 1 is a diagram showing a configuration example of an oscillation circuit 13 of this embodiment. The oscillation circuit 13 constitutes a part of a temperature compensated X'tal oscillator (TCXO). In the oscillation circuit 13, some of elements described below may be omitted or changed, or other elements may be added.

The oscillation circuit 13 is connected to an resonator element 226 and an amplification circuit 224 to form a vibrating device 200. That is, a portion of the vibrating device 200 excluding the resonator element 226 and the amplification circuit 224 corresponds to the oscillation circuit 13. Accordingly, hereinafter, description of the vibrating device 200 may be referred to when describing the oscillation circuit 13 without any particular limitation.

The oscillation circuit 13 includes a first variable capacitance part 201 and a second variable capacitance part 202 whose capacitance can be varied. The first variable capacitance part 201 includes at least a varactor 21A (see FIG. 2, corresponding to a first variable capacitance element according to the invention) whose capacitance can be varied on the basis of a potential difference between a first control voltage $V_{C1}$ (see FIG. 2) as one of control voltages $V_C$ and a first reference voltage $V_{r1}$. The second variable capacitance part 202 includes at least a varactor 22A (see FIG. 2, corresponding to a second variable capacitance element according to the invention) whose capacitance can be varied on the basis of a potential difference between the first control voltage $V_{C1}$ (see FIG. 2) and a second reference voltage $V_{r2}$. Accordingly, the oscillation circuit 13 can change capacitance of the first variable capacitance part 201 and the second variable capacitance part 202 by the first control voltage $V_{C1}$.

The oscillation circuit 13 forms the vibrating device 200 as in FIG. 1 and outputs an oscillation signal 124. As shown in FIG. 1, two connection parts of the resonator element 226 and the oscillation circuit 13 are distinguished so as to belong to different sides, the side on which the oscillation signal 124 is output is referred to as the output side, and the opposite side is referred to as the input side. Then, the first variable capacitance part 201 and the second variable capacitance part 202 are respectively connected to the input side and the output side of the resonator element 226. That is, the first variable capacitance part 201 and the second variable capacitance part 202 are connected to an oscillation loop, and composite capacitance of the first variable capacitance part 201 and the second variable capacitance part 202 changes with the first control voltage $V_{C1}$, causing change in frequency of the oscillation signal 124.

The first variable capacitance part 201 and the second variable capacitance part 202 may respectively include only the varactor 21A and the varactor 22A, however, as described later, includes a capacitor having fixed capacitance or a variable capacitance element whose capacitance can be varied with a control voltage different from the first control voltage $V_{C1}$. Accordingly, the control voltage $V_C$ of the oscillation circuit 13 has a plurality of control voltages as well as the first control voltage V.

As the resonator element 226, for example, a surface acoustic wave (SAW) resonator, an AT cut crystal vibrator, an SC cut crystal vibrator, a tuning fork crystal vibrator, other piezoelectric vibrators, a micro electro mechanical systems (MEMS) vibrator, or the like may be used. The oscillation circuit 13 of the embodiment is connected to the AT cut crystal vibrator 26 (see FIG. 2).

As a basic material of the resonator element 226, a piezoelectric material, such as crystal, piezoelectric single crystal, such as lithium tantalate or lithium niobate, or piezoelectric ceramics, such as lead zirconate titanate, or a silicon semiconductor material, or the like may be used. As a means for exciting the resonator element 226, excitation by a piezoelectric effect may be used, or electrostatic driving by Coulomb's force may be used.

As the amplification circuit 224, a bipolar transistor, a field effect transistor (FET), a metal oxide semiconductor field effect transistor (MOSFET), or the like may be used. The oscillation circuit 13 of this embodiment is constituted by a MOSFET, and is connected to the inverter 24 (see FIG. 2) including a feedback resistor 28.

The oscillation circuit 13 may be formed on a substrate using electronic components, or may be implemented in the form of an integrated circuit (IC) and provided as a semiconductor integrated circuit device. Since the oscillation circuit 13 is an electronic component in the form of a single chip, user-friendliness is achieved. A form including the amplification circuit 224, that is, an oscillation circuit 12 of FIG. 1 may be implemented in the form of an IC. At this time, the vibrating device 200 (for example, an oscillator) can be formed only through connection to the resonator element 226, thereby achieving user-friendliness.

All or a part of the first reference voltage $V_{r1}$, the second reference voltage $V_{r2}$, and the control voltage $V_C$ of FIG. 1 may be generated inside the oscillation circuit 13, or may be supplied from the outside of the oscillation circuit 13. For example, the oscillation circuit 13 may include a voltage generation unit (not shown), and the voltage generation unit may generate all or a part of these voltages in accordance with a set value of a register (not shown) which is accessible from the outside of the oscillation circuit 13. At this time, an IC including the voltage generation unit may be implemented.

1.2. Circuit Configuration

Figure 2:
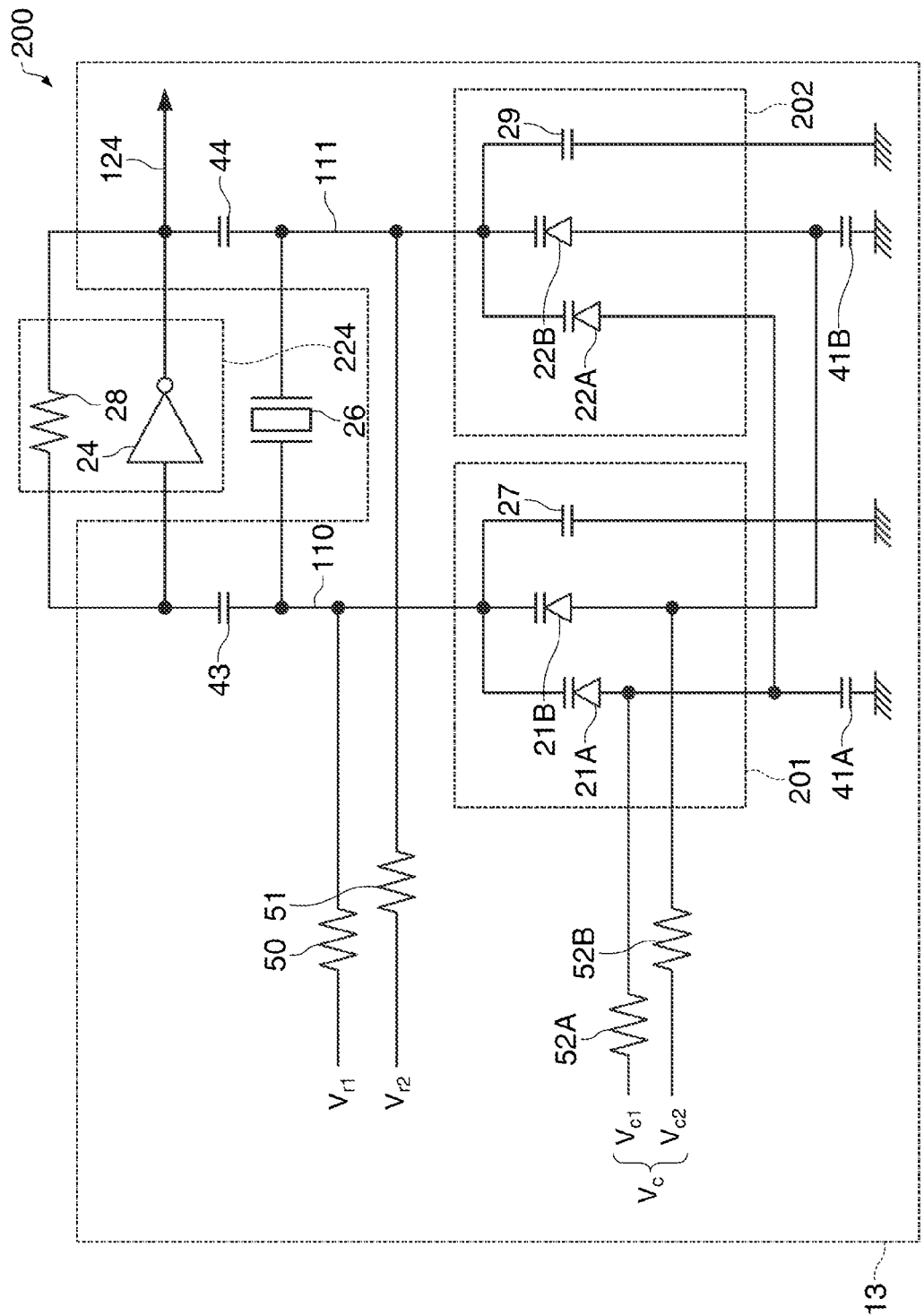
FIG. 2 is a diagram showing a circuit configuration example of a vibrating device including the oscillation circuit of this embodiment.

FIG. 2 is a diagram showing a circuit configuration example of the vibrating device 200 including the oscillation circuit 13 of this embodiment. As shown in FIG. 1, the oscillation circuit 13 is connected to the resonator element 226 and the amplification circuit 224 to form the vibrating device 200, and in this example, the resonator element 226 is a crystal vibrator 26. The amplification circuit 224 is an inverter 24 including a feedback resistor 28. The inverter 24 has a property to amplify an input signal, and as shown in FIG. 2, includes the crystal vibrator 26 to form an oscillation loop from the output to the input of the inverter 24.

In order to oscillate the crystal vibrator 26, it is not sufficient to simply connect the inverter 24 which outputs a digital signal, and the feedback resistor 28 which adjusts an operating point by self-bias is required. That is, the inverter 24 includes the feedback resistor 28, and thus functions as an analog inverting amplifier.

Hereinafter, the elements constituting the oscillation circuit 13 will be described. In the oscillation circuit 13, the first variable capacitance part 201 and the second variable capacitance part 202 respectively include the varactor 21A and the varactor 22A. The first variable capacitance part 201 further includes a varactor 21B and a capacitor 27 having fixed capacitance. The second variable capacitance part 202 further includes a varactor 22B and a capacitor 29 having fixed capacitance.

Since capacitance of the varactor 21A, the varactor 22A, the varactor 21B, and the varactor 22B change with the control voltages $V_{C1}$ and $V_{C2}$, composite capacitance of the oscillation circuit 13 also fluctuates, and the frequency of the oscillation signal 124 changes. The varactor 21A, the varactor 22A, the varactor 21B, and the varactor 22B are MOS variable capacitance elements. Although a variable capacitance element may be of a PN junction type, a MOS variable capacitance element is widely used for the purposes of implementation of an integrated circuit and low voltage. The control voltages $V_{C1}$ and $V_{C2}$ individually represent the control voltages which constitute the control voltage $V_C$ of FIG. 1.

The back-gates (when the polarity of the varactor is inverted, the gates) of the varactor 21A and the varactor 22A are grounded through a capacitor 41A having fixed capacitance. The back-gates (when the polarity of the varactor is inverted, the gates) of the varactor 21B and the varactor 22B are grounded through a capacitor 41B having fixed capacitance. In this example, although the capacitor 41A and the capacitor 41B are excluded from the first variable capacitance part 201 and the second variable capacitance part 202, the capacitor 41A and the capacitor 41B may be handled as being included in the first variable capacitance part 201 and the second variable capacitance part 202.

Although the oscillation circuit 13 is provided with DC cut capacitors 43 and 44 inside the oscillation loop, one or both of the DC cut capacitors 43 and 44 may be omitted. When the DC cut capacitors 43 and 44 are omitted, since nodes 110 and 111 are at a self-bias voltage caused by the inverter 24 including the feedback resistor 28, the first reference voltage $V_{r1}$ and the second reference voltage $V_{r2}$ are not required.

The first reference voltage $V_{r1}$ is applied to the node 110 on the first variable capacitance part 201 side, that is, the gates (when the polarity of the varactor is inverted, the back-gates) of the varactor 21A and the varactor 21B and the ungrounded terminal of the capacitor 27 through an input resistor 50. The second reference voltage $V_{r2}$ is applied to the node 111 on the second variable capacitance part 202 side, that is, the gates (when the polarity of the varactor is inverted, the back-gates) of the varactor 22A and the varactor 22B and the ungrounded terminal of the capacitor 29 through an input resistor 51.

A control voltage $V_{C1}$ is applied to the back-gates (when the polarity of the varactor is inverted, the gates) of the varactor 21A and the varactor 22A through an input resistor 52A. A control voltage $V_{C2}$ is applied to the back-gates (when the polarity of the varactor is inverted, the gates) of the varactor 21B and the varactor 22B through an input resistor 52B.

The oscillation circuit 13 sets the first reference voltage $V_{r1}$ and the second reference voltage $V_{r2}$ at different potentials (for example, $V_{r1} < V_{r2}$), and performs adjustment such that, for example, the C-V characteristic of the varactor 21A is linear in a region lower than the center voltage of the control voltage, and for example, the C-V characteristic of the varactor 22A is linear in a region higher than the center voltage of the control voltage. For this reason, it is possible to allow the control voltage to fluctuate in a wider range than the related art. This will be described below in detail.

1.3. Relationship Between Control Voltage and Capacitance

In the oscillation circuit 13, the control voltage is used in common in the varactor 21A and the varactor 22A (or the varactor 21B and the varactor 22B), and the first reference voltage $V_{r1}$ and the second reference voltage $V_{r2}$ are set at different potential by a bias voltage. That is, different potential differences are given to the varactor 21A and the varactor 22A (or the varactor 21B and the varactor 22B). Hereinafter, the relationship between a control voltage and capacitance and the effect of a bias voltage will be described referring to FIGS. 3 to 5.

Figure 3:
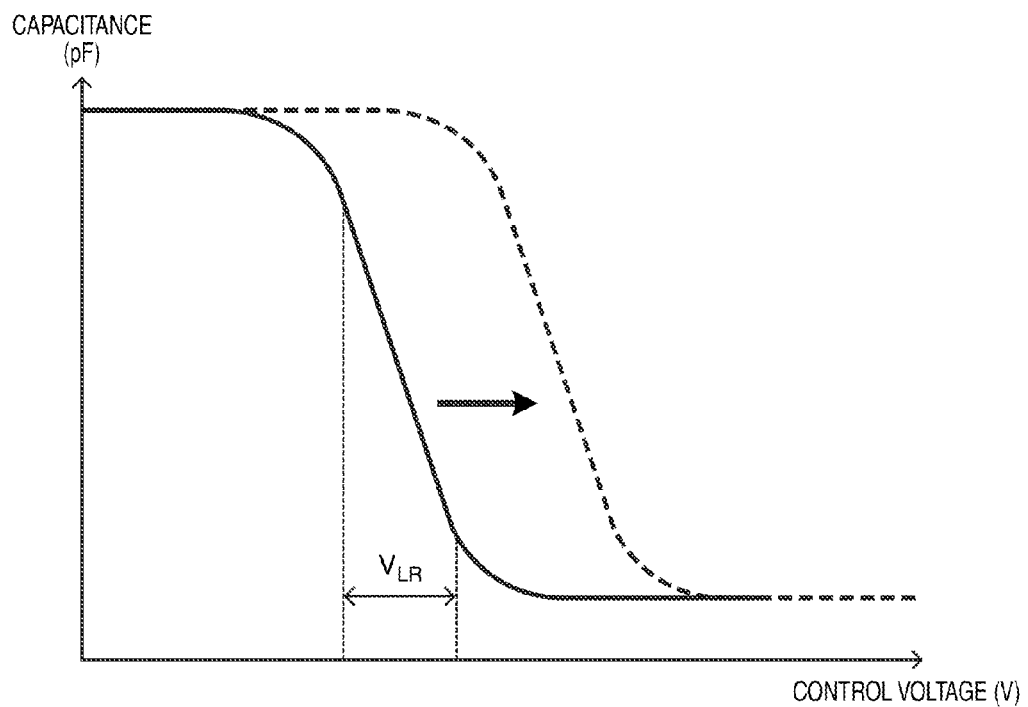
FIG. 3 is a diagram showing change in capacitance with respect to a control voltage of a MOS variable capacitance element.

FIG. 3 is a diagram showing change in capacitance with respect to a control voltage of one MOS variable capacitance element (corresponding to the varactor 21A, the varactor 22A, the varactor 21B, or the varactor 22B of FIG. 2). Here, a variable capacitive element may be of a PN junction type, however, as in this embodiment, a MOS variable capacitive element is widely used for the purposes of implementation of an integrated circuit (IC) and low voltage.

A MOS variable capacitance element has a feature in that capacitance changes steeply in a narrow voltage range, compared to a PN junction type. For this reason, a linear region of a curve (hereinafter, referred to as capacitance characteristic) representing change in capacitance is narrow. In general, in an oscillation circuit which uses a MOS variable capacitance element, if the magnitude of change in capacitance is the same, the amount of change in frequency of the oscillation signal should be the same. This is because, when change in capacitance is the same and the amount of change in frequency is biased, it is difficult for the oscillation circuit to appropriately adjust the frequency.

Accordingly, if the oscillation circuit has only one MOS variable capacitance element, in frequency adjustment, a voltage range with excellent linearity, that is, only $V_{LR}$ in FIG. 3 is used. At this time, there is a problem in that the frequency variable width is inevitably small, and it is not possible to realize a necessary frequency variable width as the oscillation circuit. If the size of a MOS variable capacitance element increases, a capacitance change width can be increased. Meanwhile, at this time, large change in capacitance (=large change in frequency) occurs in a narrow voltage range of $V_{LR}$. It is not advisable in that variable sensitivity in frequency with respect to voltage becomes high, and as a result, deterioration of an electrical characteristic, such as phase noise, occurs.

A bias voltage is given to one terminal (the reference voltage side or the control voltage side, and in this example, the reference voltage side) of a MOS variable capacitance element, thereby shifting a capacitance characteristic with respect to an absolute voltage to control. FIG. 3 shows a state where, if a bias voltage is given to the reference voltage side of a MOS variable capacitance element, a capacitance characteristic of a solid line is shifted to a capacitance characteristic indicated by a dotted line.

Figure 4:
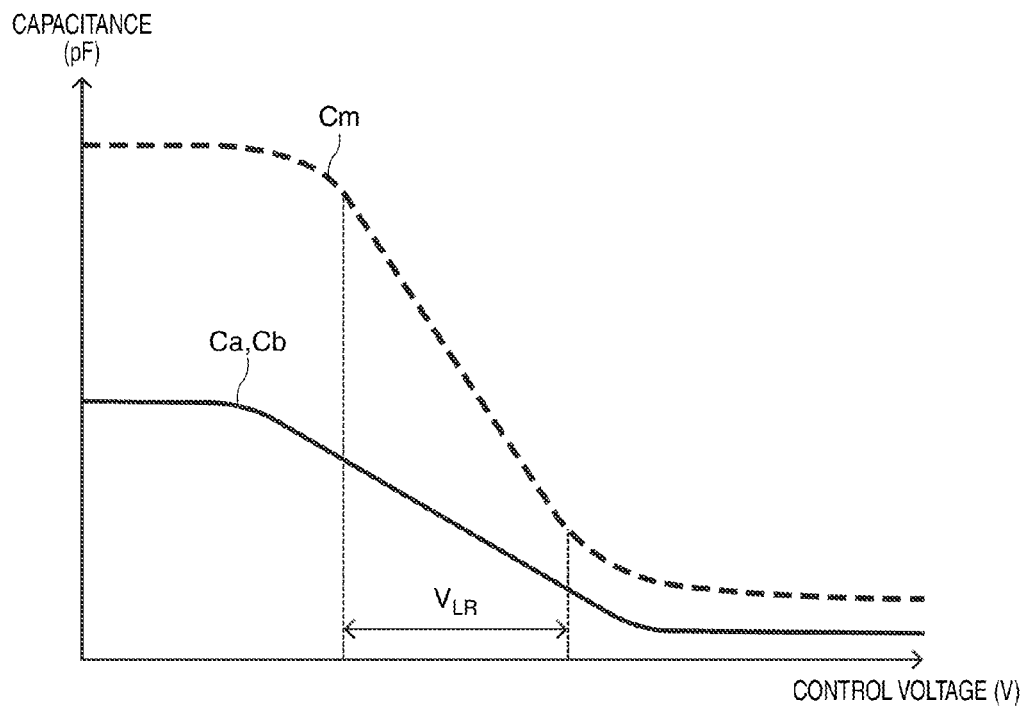
FIG. 4 is a diagram showing change in composite capacitance of a plurality of MOS variable capacitance elements with respect to a control voltage (when a bias voltage is not applied).

Hereinafter, a case where a voltage range with excellent linearity is expanded in accord with the above property when an oscillation circuit has a plurality of MOS variable capacitance elements. FIG. 4 shows capacitance characteristics Ca and Cb and a curve (hereinafter, referred to as a composite capacitance characteristic Cm) representing change in composite capacitance when an oscillation circuit has two MOS variable capacitance elements.

At this time, even though change shown in FIG. 4 is obtained by applying the same reference voltage to one terminal of the two MOS variable capacitance elements and applying the same control voltage to the other terminal, only if change in composite capacitance characteristic Cm is steep, a voltage range ($V_{LR}$ of FIG. 4) with excellent linearity is the same as when only one MOS variable capacitance element is provided (see $V_{LR}$ of FIG. 3).

However, when different reference voltages are applied to one terminal of the two MOS variable capacitance elements, that is, when a bias voltage is provided, it is possible to expand a voltage range ($V_{LR}$ of FIG. 5) with excellent linearity of the composite capacitance characteristic Cm. At this time, the reference voltages to be applied are adjusted such that the capacitance characteristic Ca is linear in a region lower than a center voltage (when Vdd=1.8V, for example, 0.9 V) of the control voltage, and the capacitance characteristic Cb is linear in a region higher than the center voltage of the control voltage. If the shift amount of the reference voltage has an optimum value, the curves of the two variable capacitance characteristics are combined, thereby obtaining continuous large change in capacitance in a wide voltage range.

Figure 5:
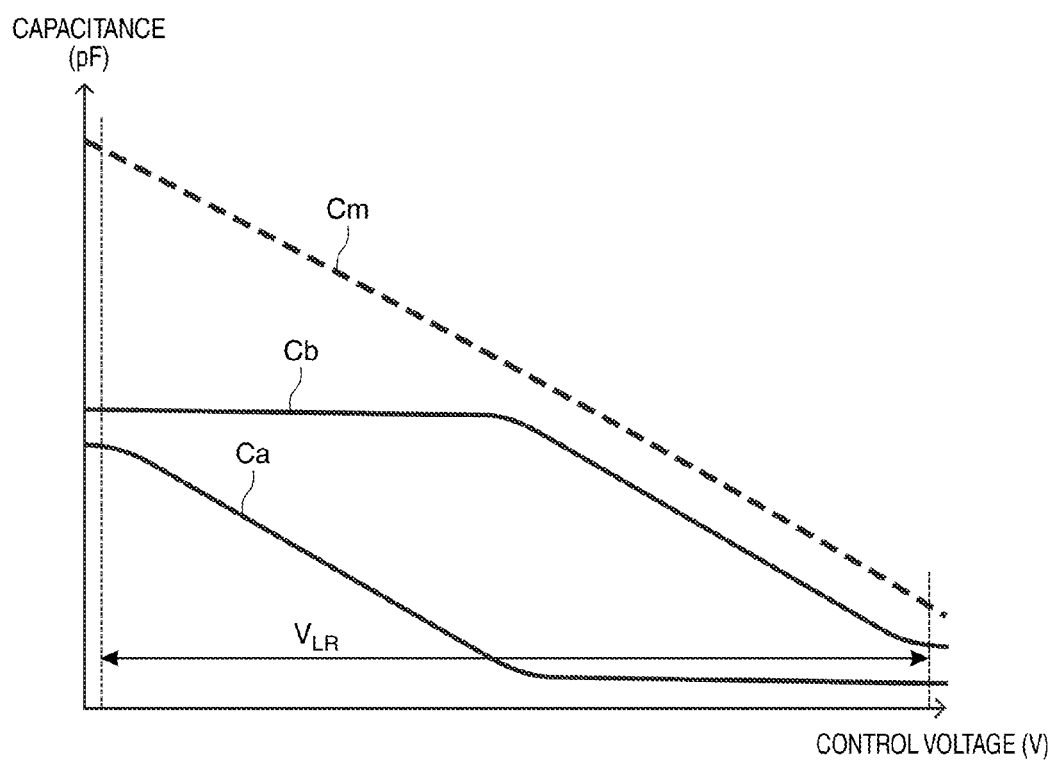
FIG. 5 is a diagram showing change in composite capacitance of a plurality of MOS variable capacitance elements with respect to a control voltage (when a bias voltage is applied and adjusted).

An oscillation circuit which includes two MOS variable capacitance elements having the composite capacitance characteristic Cm shown in FIG. 5 can allow the control voltage to fluctuate in a wide range (the range of $V_{LR}$ of FIG. 5) compared to the related art while securing linearity, thereby obtaining a necessary frequency variable width, and since variable sensitivity does not increase, it is possible to achieve compatibility with a phase noise characteristic. The oscillation circuit 13 sets the first reference voltage $V_{r1}$ and the second reference voltage $V_{r2}$ at different potentials ($V_{r1}<V_{r2}$), thereby allowing the control voltage to fluctuate in a wide range compared to the related art.

1.4. Comparative Example

Figure 6:
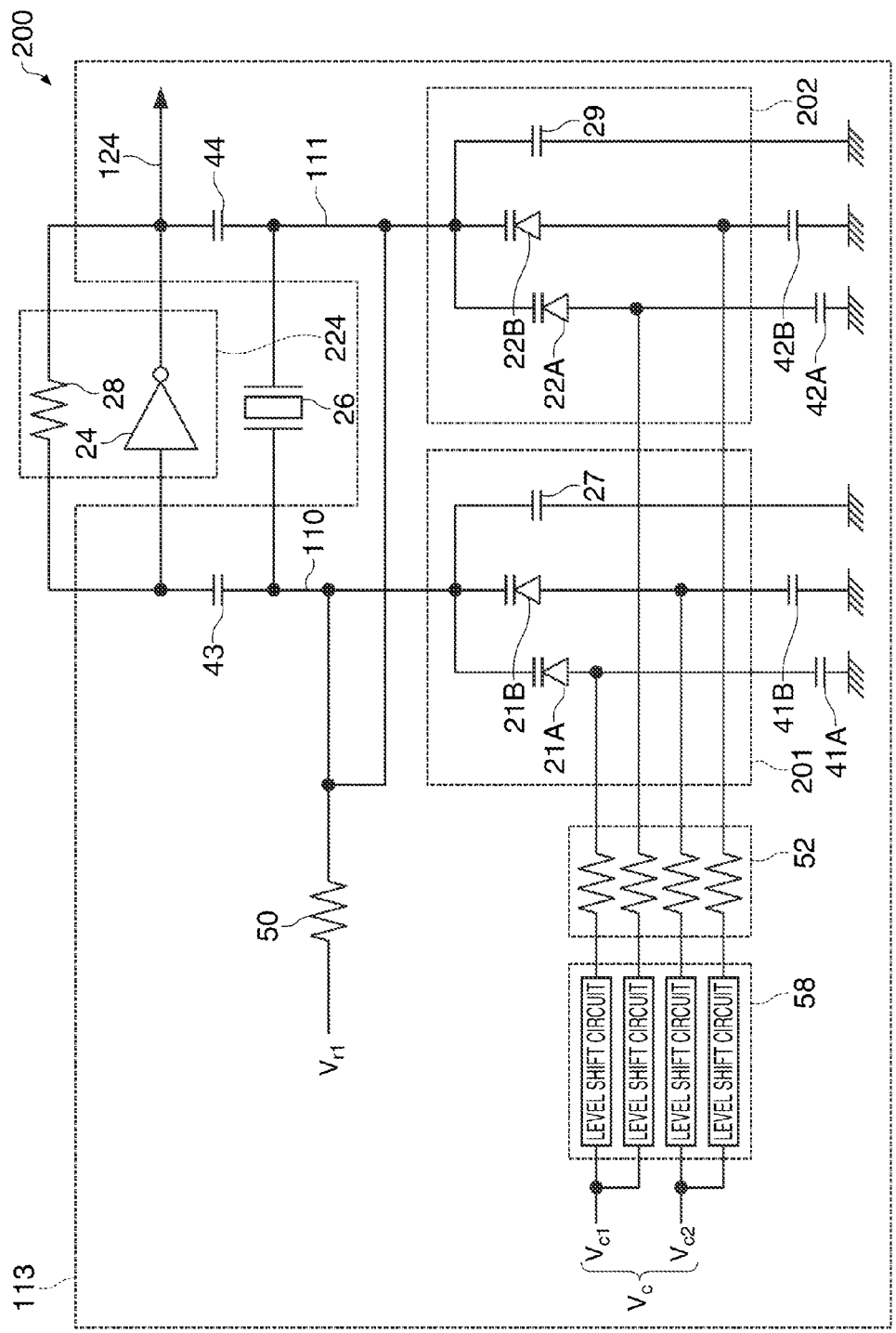
FIG. 6 is a diagram showing a configuration example of an oscillation circuit of a comparative example.

FIG. 6 is a diagram showing an oscillation circuit 113 of a comparative example for comparison with the oscillation circuit 13 of this embodiment. The oscillation circuit 113 of the comparative example uses a method disclosed in JP-A-2007-19565 in which a level shift circuit 58 is provided on the control voltage $V_C$ side in order to expand a voltage range with excellent linearity for the composite capacitance characteristic Cm (see FIG. 5). The same elements as those in FIGS. 1 to 2 are represented by the same reference numerals, and description thereof will not be repeated.

In the oscillation circuit 113 of the comparative example, the first reference voltage $V_{r1}$ is applied to the node 110 on the first variable capacitance part 201 side and the node 111 on the second variable capacitance part 202 side through the input resistor 50. For example, different control voltages are applied to the back-gate terminals (when the polarity of the varactor is inverted, the gate terminals) of the varactor 21A and the varactor 22A, thereby expanding the control voltage range of the composite capacitance characteristic Cm (see FIG. 5).

When generating different control voltages, the level shift circuits 58 are used. For example, the level shift circuit 58 between the control voltage $V_{C1}$ and the varactor 21A and the level shift circuit 58 between the control voltage $V_{C1}$ and the varactor 22A perform adjustment such that an appropriate offset is provided in the back-gates (when the polarity of the varactor is inverted, the gates) of the varactor 21A and the varactor 22A. In regard to the back-gates (when the polarity of the varactor is inverted, the gates) of the varactor 21B and the varactor 22B, the same adjustment is performed by the level shift circuits 58.

However, in the oscillation circuit 113 of the comparative example, the level shift circuits 58 are required. In particular, in the TCXO, since a plurality of kinds of control voltages are used in order to increase compensation precision, the number of level shift circuits 58 increase in proportion to the number of kinds of control voltages (in this example, four level shift circuits). For this reason, circuit scale and power consumption may increase. Accordingly, when comparing with the oscillation circuit 113 of the comparative example, in the oscillation circuit 13 of this embodiment, it is possible to suppress an increase in circuit scale and power consumption.

In FIG. 6, an input resistor 52 corresponds to the input resistors 52A and 52B of FIG. 2, and the capacitors 42A and 42B having fixed capacitance correspond to the capacitors 41A and 41B of FIGS. 2 and 6, and thus detailed descriptions thereof will not be repeated.

1.5. For Selection of Size of Variable Capacitance Element

As above, for example, if the circuit configuration shown in FIG. 2 is made, in the oscillation circuit 13, it is possible to expand a variable width of a variable capacitance element while suppressing an increase in circuit scale and power consumption. However, the conclusion that the ratio in size of varactors on the input side and the output side largely relates to the relationship between linearity, the control voltage, and sensitivity (hereinafter, referred to sensitivity characteristic) in the entire variable range of the control voltage is obtained from a simulation result. Hereinafter, this will be described.

Although a simulation assumes the oscillation circuit 13 shown in FIG. 2, the purpose of the control voltage is determined as the control voltage $V_{C1}$ for temperature compensation and the control voltage $V_{C2}$ for external control. The control voltage $V_{C2}$ for external control is used, for example, for fixed and static change in capacitance to correct deviation in frequency accompanied by distortion due to thermal impact in a reflow process. The control voltage $V_{C1}$ for temperature compensation is used for fluctuating and dynamic change in capacitance according to an ambient temperature detected by a temperature sensor.

Figure 7A:
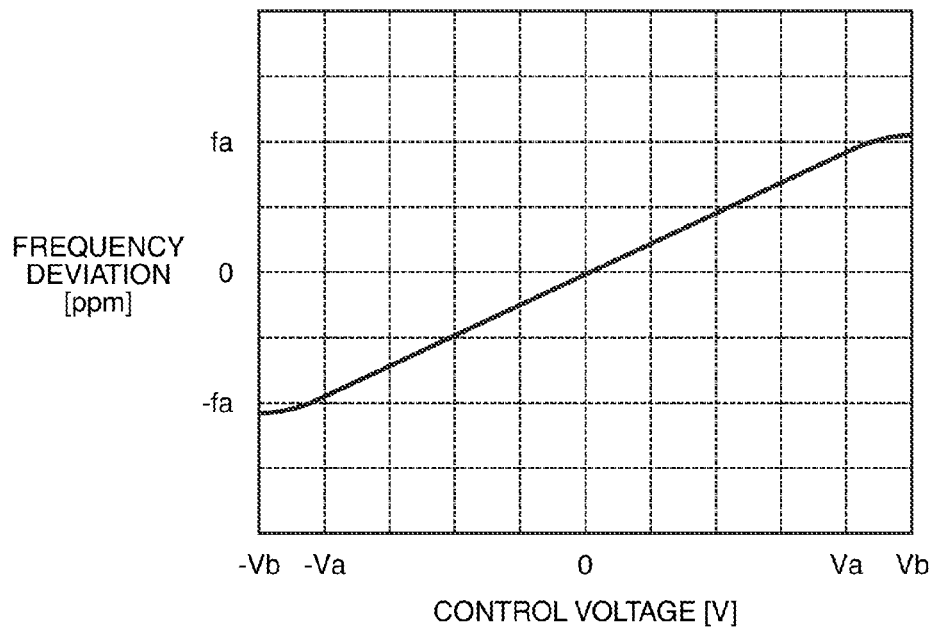
FIGS. 7A and 7B are diagrams illustrating the relationship between a control voltage, a frequency deviation, and sensitivity.
Figure 7B:
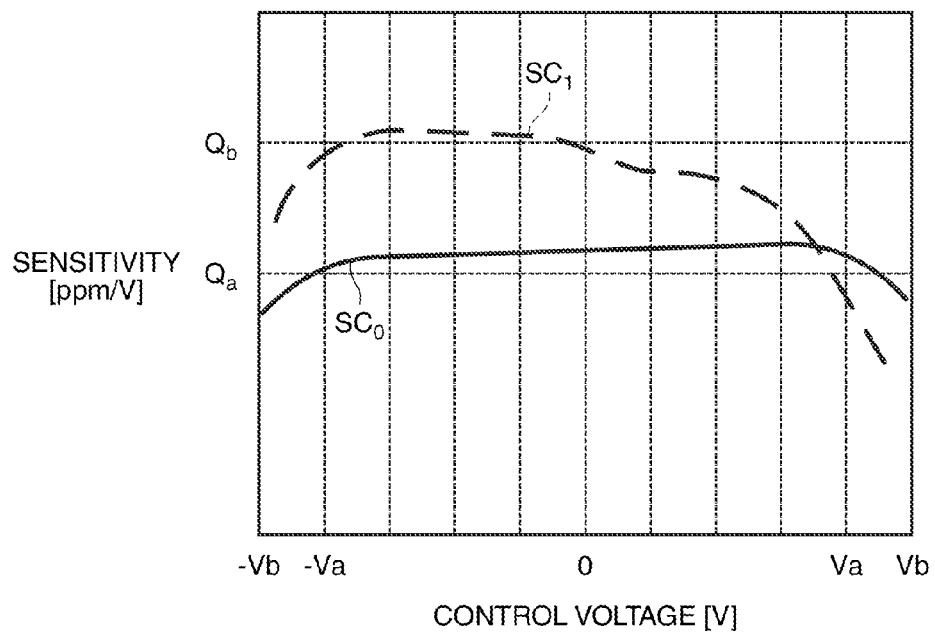

1.5.1. Relationship Between Control Voltage, Frequency Deviation, and Sensitivity FIGS. 7A and 7B are diagrams illustrating the relationship between a control voltage, a frequency deviation, and sensitivity. For ease of understanding of the relationship, in the horizontal axis of FIGS. 7A and 7B, the center voltage (in the example referring to FIG. 5, Vdd=1.8 V, 0.9 V) is 0 V. The same applies to FIGS. 9A, 9B, 11, and 13A to 15B described below. In the following description, for example, "the control voltage is +Va [V]" means "the control voltage is the center voltage+Va [V]".

A frequency deviation on the vertical axis of FIG. 7A represents the result of dividing a deviation df between a frequency when the control voltage fluctuates and a frequency (hereinafter, referred to as a reference frequency f) which becomes a reference frequency when control voltage is 0 V by the reference frequency f in terms of ppm, for the frequency of the oscillation signal 124.

FIG. 7A shows the relationship (hereinafter, referred to as a frequency deviation characteristic) between a control voltage and a frequency deviation for the two MOS variable capacitance elements (varactors 21A and 22A) having the composite capacitance characteristic Cm (see FIG. 5) with excellent linearity in the oscillation circuit 13. At this time, the frequency deviation characteristic is substantially linear, and the slope is the same on the left and right sides of 0 V as the center voltage of the control voltage.

At this time, a solid line $SC_0$ of FIG. 7B indicates a sensitivity characteristic when the frequency deviation characteristic of FIG. 7A is converted in terms of sensitivity. Sensitivity is a frequency deviation per 1 V and corresponds to the slope of FIG. 7A. The solid line $SC_0$ of FIG. 7B is substantially flat, and it is understood that linearity of composite capacitance is satisfactory without depending on the control voltage, that is, an excellent sensitivity characteristic is achieved.

When a sensitivity characteristic like a dotted line $SC_1$ of FIG. 7B is obtained, sensitivity largely changes with the control voltage. For this reason, it cannot be said that a sensitivity characteristic is satisfactory, and since linearity of a frequency with respect to a control voltage is not satisfactory, sensitivity design of the oscillation circuit 13 may be varied.

That is, first, the oscillation circuit 13 should be designed such that a sensitivity characteristic is flat as indicated by the solid line $SC_0$ of FIG. 7B. Va, Vb, Qa, and Qb on the axes of FIGS. 7A and 7B will be described below.

A necessary fluctuation range of the control voltage will be described. The fluctuation range of the control voltage should be set so as to compensate for variation in frequency taking into consideration individual differences of the resonator element 226 and the amplification circuit 224.

Figure 8:
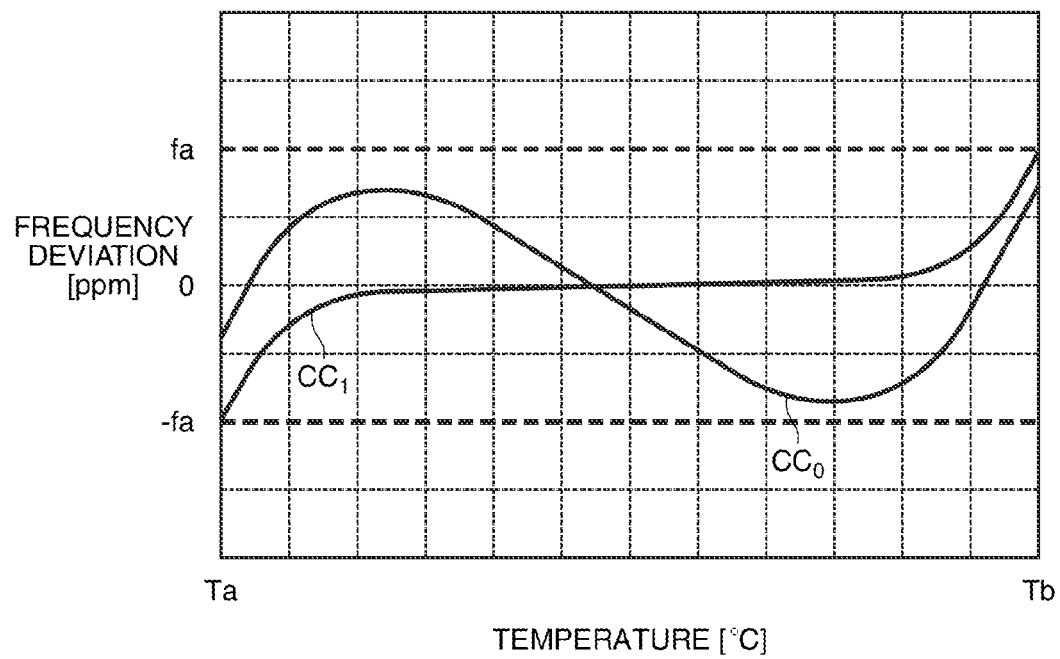
FIG. 8 is a diagram illustrating a control voltage range necessary for temperature compensation.

FIG. 8 shows change in frequency deviation for the oscillation signal 124 of the vibrating device 200 including a plurality of oscillation circuits 13 in an operable temperature range from a temperature Ta to a temperature Tb. The frequency deviation on the vertical axis of FIG. 8 represents the result of dividing a deviation ΔF between a prescribed frequency F when an ambient temperature is 25° C. and an actual frequency by the prescribed frequency F in terms of ppm.

In FIG. 8, a curve $CC_0$ representing change of one frequency deviation shows that a minimum value of a frequency deviation in an operable temperature range is greater than −fa, and a maximum value does not reach +fa. However, a curve $CC_1$ representing change in a frequency deviation of a different vibrating device 200 shows that the frequency deviation at temperature Ta is −fa, and the frequency deviation at temperature Tb is +fa. That is, if an individual difference of the vibrating device 200 is taken into consideration, it is necessary to compensate for variation in frequency in a range of −fa to +fa. The oscillation circuit 13 forms a part of the TCXO, and the fluctuation range of the first control voltage $V_{C1}$ capable of compensating for variation in frequency of −fa to +fa is required. On this assumption, the control voltage $V_{C1}$ for temperature compensation in the oscillation circuit 13 and sensitivity design of the varactors 21A and 22A will be described.

Figure 9A:
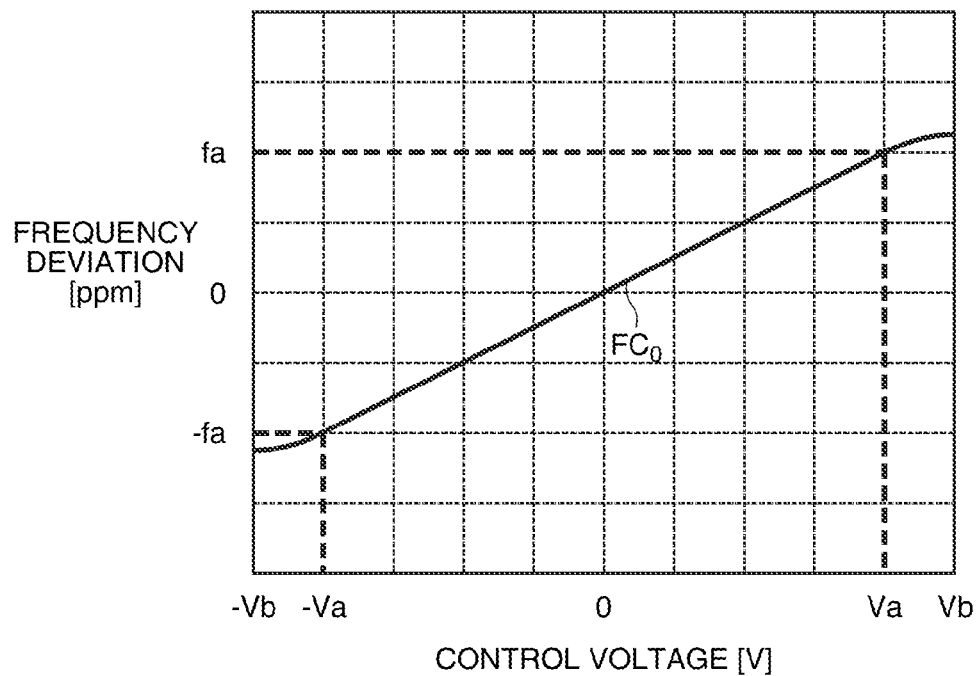
FIGS. 9A and 9B are diagrams illustrating fluctuation in a control voltage range by design for sensitivity of a varactor.

FIG. 9A is a diagram illustrating the fluctuation range of the control voltage $V_{C1}$ for temperature compensation of the oscillation circuit 13. In FIG. 9A, −Vb and +Vb are limit values of the fluctuation range which are present naturally in designing the oscillation circuit 13. For example, Vb may be Vdd/2. In FIG. 9A, the same elements as those in FIG. 7A are represented by the same reference numerals, and descriptions thereof will not be repeated. The same applies to FIG. 9B.

Here, it is assumed that composite capacitance of the varactors 21A and 22A have a frequency deviation characteristic like a curve $FC_0$ of FIG. 9A. At this time, the fluctuation range of the control voltage $V_{C1}$ for temperature compensation may be −Va to +Va. That is, if the fluctuation range of the control voltage $V_{C1}$ is −Va to +Va, the oscillation circuit 13 can perform temperature compensation on a frequency deviation of −fa to +fa. Since Va<Vb, design is possible.

Figure 9B:
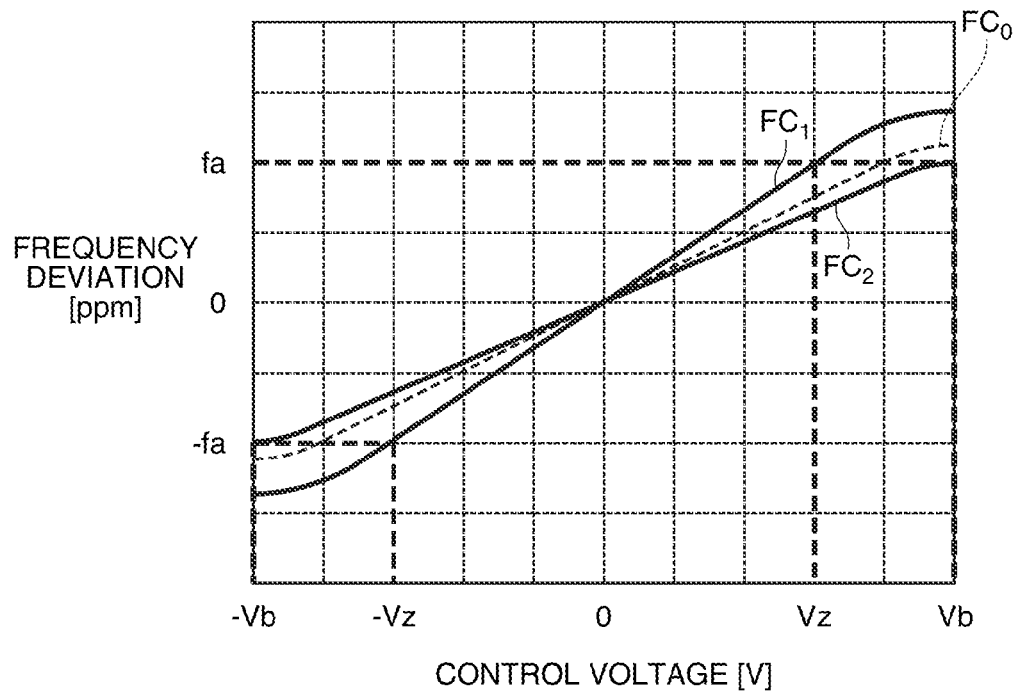

FIG. 9B is a diagram showing change in frequency deviation characteristic, specifically, change in slope by sensitivity design of composite capacitance of the varactors 21A and 22A. By changing the size of the varactors 21A and 22A, or by changing the values of the variable capacitance parts, a curve $FC_0$ indicated by a dotted line of FIG. 9B can change like curves $FC_1$ and $FC_2$ of solid lines. The curve $FC_0$ of the dotted line of FIG. 9B corresponds to the curve $FC_0$ of FIG. 9A.

It is assumed that, by changing the size of the varactors 21A and 22A, a frequency deviation characteristic like the curve $FC_2$ of the solid line of FIG. 9B is obtained. At this time, if the fluctuation range of the control voltage $V_{C2}$ is −Vz to +Vz, the oscillation circuit 13 can perform temperature compensation on the frequency deviation of −fa to +fa. Here, Vz<Va (see FIG. 9A), the slope of a linear portion of the curve $FC_1$ is greater than the corresponding portion of the curve $FC_0$, and sensitivity increases.

Conversely, it is assumed that, by changing the size of the varactors 21A and 22A, a frequency deviation characteristic like the curve $FC_2$ of the solid line of FIG. 9B is obtained. At this time, if the fluctuation range of the control voltage $V_{C1}$ is not −Vb to +Vb, the oscillation circuit 13 cannot perform temperature compensation on the frequency deviation of −fa to +fa. Here, Vb>Va (see FIG. 9A), the slope of a linear portion of the curve $FC_2$ is smaller than the corresponding portion of the curve $FC_0$, and sensitivity is lowered.

Here, when sensitivity is high, since temperature compensation on the frequency deviation of −fa to +fa is possible in a narrower fluctuation range of the control voltage $V_{C1}$, it is considered that design is satisfactory. However, when sensitivity is high, there is a problem in that phase noise increases.

Figure 10:
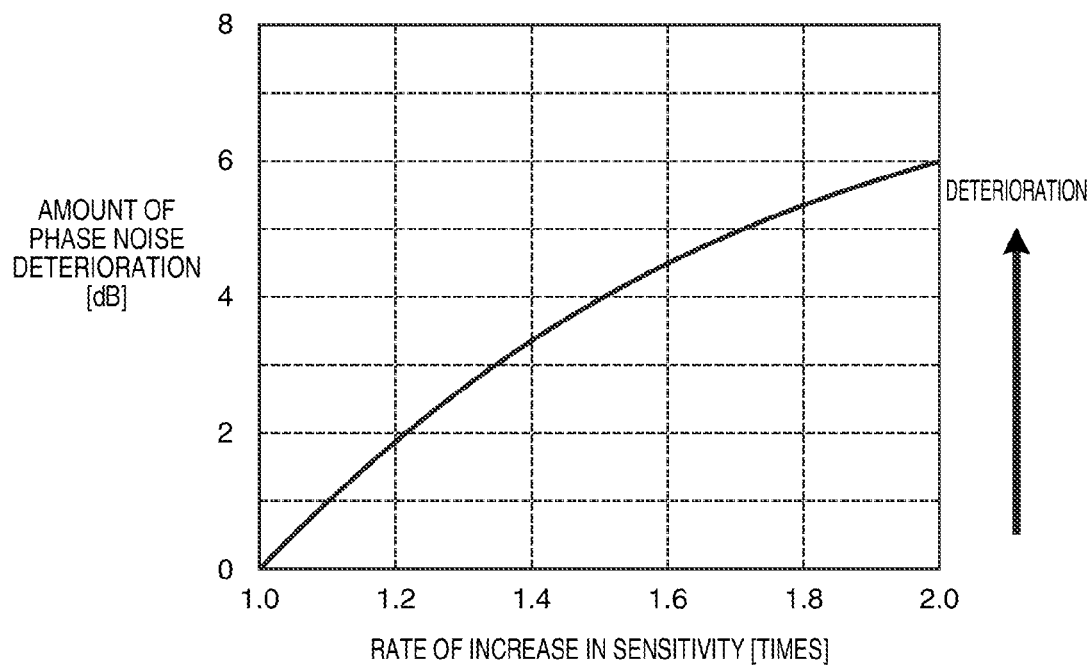
FIG. 10 is a diagram illustrating the relationship between sensitivity and phase noise.

FIG. 10 is a diagram illustrating the relationship between sensitivity and phase noise. In FIG. 10, the horizontal axis represents a rate of increase in sensitivity by relative comparison. In FIG. 10, the vertical axis represents the amount of deterioration of 1 KHz dephasing with respect to carriers of phase noise in terms of dB, and also represents that, as the value increases, phase noise increases, and quality of the oscillation signal 124 is deteriorated.

Referring to FIG. 10, if the rate of increase in sensitivity is twice, phase noise is deteriorated by 6 dB. For this reason, in regard to the sensitivity characteristic (see FIG. 7B), the maximum value should be equal to or smaller than an upper limit sensitivity Qb (see FIG. 7B) representing allowable phase noise and equal to or greater than a lower limit sensitivity Qa (see FIG. 7B). For example, the lower limit sensitivity Qa may be determined such that the fluctuation range of the control voltage $V_{C1}$ falls within design limit values −Vb to +Vb.

For example, in the example of FIG. 9B, even in the frequency deviation characteristic of the curve $FC_2$, if the maximum value of sensitivity is equal to or greater than the lower limit sensitivity Qa, the size of the varactors 21A and 22A may be selected such the frequency deviation characteristic becomes the curve $FC_2$ rather than the curve $FC_1$. This is because, if sensitivity is suppressed, phase noise decreases.

As described above, in the oscillation circuit 13, it is necessary to perform sensitivity design of the variable capacitance elements (varactors 21A and 22A) for temperature compensation such that variation in frequency is compensated for in the range of −fa to +fa, a curve representing a sensitivity characteristic is flat, and the maximum value is equal to or greater than the lower limit sensitivity Qa and equal to or smaller than the upper limit sensitivity Qb. Hereinafter, sensitivity design (specifically, selection of appropriate size) of the varactors 21A and 22A is examined on the basis of the result of a simulation assuming that the overall composite load capacitance of the oscillation circuit is 4 to 7 [pF]. At this time, flatness of a curve representing a sensitivity characteristic is also examined.

1.5.2. For Size of Varactor

Figure 11:
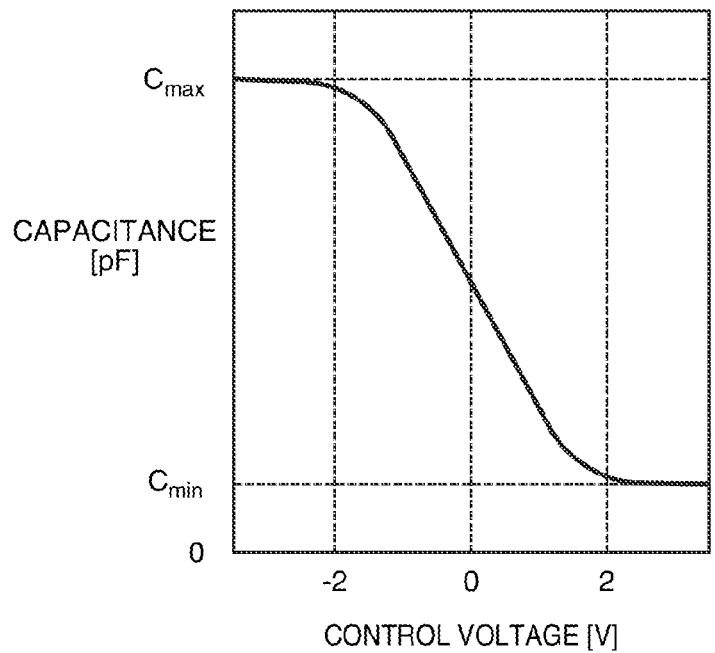
FIG. 11 is a diagram showing a characteristic of a varactor of basic size (once) which is used to select the size of a varactor of the oscillation circuit of this embodiment.

FIG. 11 is a diagram showing a characteristic of a varactor of basic size (once) which is used to select the size of the varactors 21A and 22A of the oscillation circuit 13. The varactors 21A and 22A are constituted so as to be of size corresponding to an integer multiple of a varactor of basic size. For this reason, it is assumed that a varactor of basic size of FIG. 11 is sufficiently small (for example, $C_{min}$ of FIG. 11 is equal to or smaller than 0.1 pF). In this example, it is assumed that, in regard to capacitance on the vertical axis of FIG. 11, $C_{max}/C_{min}$ is a capacitance ratio of 5 to 6. Although the control voltage on the horizontal axis exceeds +2 V and −2 V, capacitance is saturated, this is one example and is not fixed.

Hereinafter, when representing the size of the varactors 21A and 22A, expression of P times (where P is a natural number) of basic size is used. For example, a varactor of size corresponding to four times greater than basic size has a capacitance characteristic of $4 \times C_{max}$ and $4 \times C_{min}$, instead of $C_{max}$ and $C_{min}$ of FIG. 11.

Figure 12:
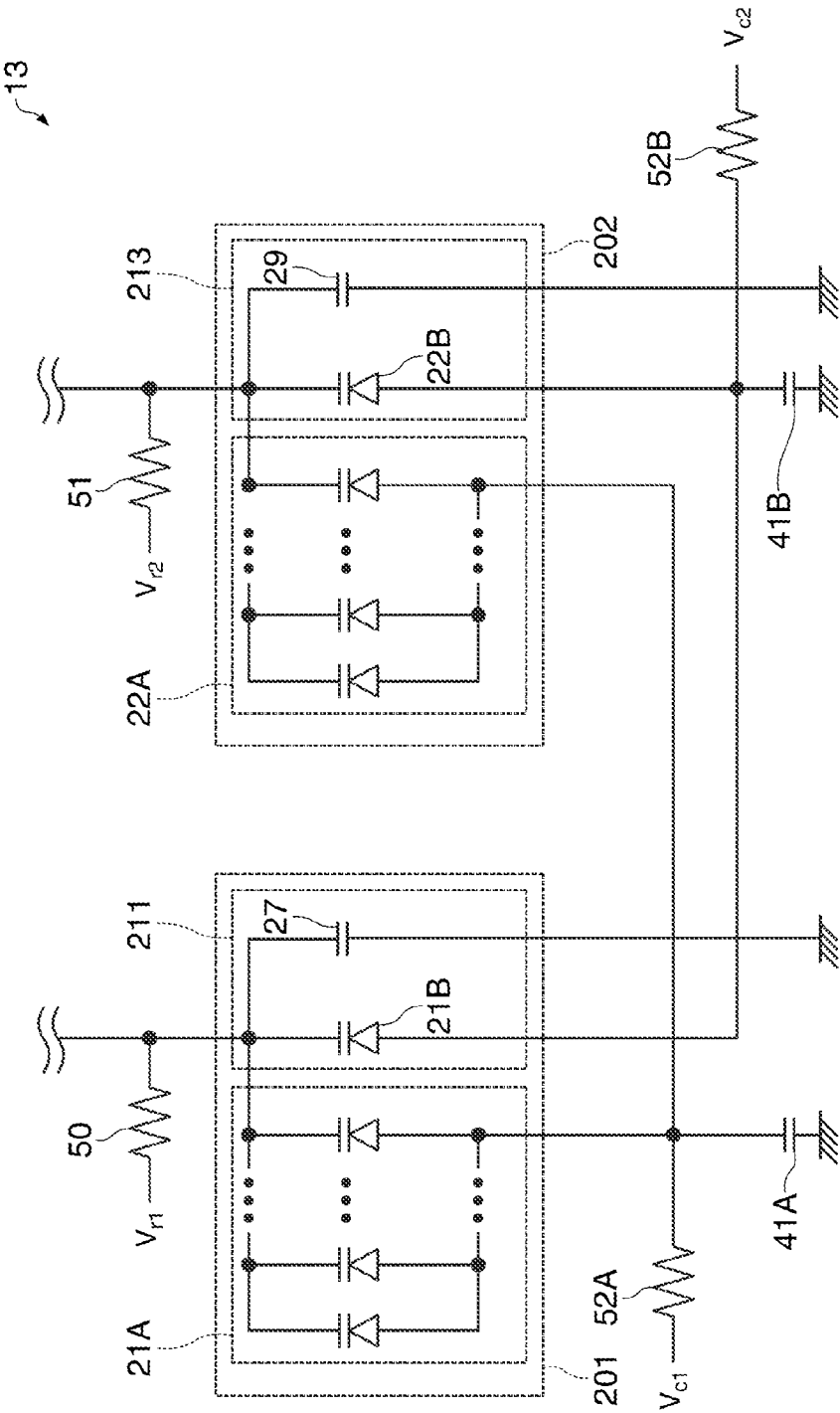
FIG. 12 is a diagram illustrating the arrangement of a varactor of basic size in the oscillation circuit of this embodiment.

FIG. 12 is a diagram illustrating the arrangement of the first variable capacitance part 201 and the second variable capacitance part 202 of a varactor of basic size in the oscillation circuit 13. The oscillation circuit 13 of FIG. 12 corresponds to FIG. 2, and a part thereof is omitted. The same elements are represented by the same reference numerals, and descriptions thereof will not be repeated.

As in FIG. 12, the varactors 21A and 22A are constituted by arranging several varactors of basic size in parallel. For example, when the varactor 21A is constituted by arranging ten varactors of basic size, the varactor 21A is a varactor of size corresponding to ten times greater than basic size. For example, when the varactor 22A is constituted by arranging 12 varactors of basic size, the varactor 22A is a varactor of size corresponding to 12 times greater than basic size.

A simulation is performed so as to confirm whether or not the oscillation circuit 13 compensates for variation in frequency in the range of −fa to +fa, the curve representing the sensitivity characteristic is flat, and the maximum value is equal to or greater than the lower limit sensitivity Qa and equal to or smaller than the upper limit sensitivity Qb while changing the size of the varactors 21A and 22A many times greater than basic size. Here, the simulation conditions at this time will be described.

The first reference voltage $V_{r1}$ and the second reference voltage $V_{r2}$ have a relationship of $V_{r1}<V_{rm}<V_{r2}$. Here, $V_{rm}$ is the center voltage of the control voltage and is given by $V_{rm}=((V_{r1}+V_{r2})/2)$. As described above, in display of the simulation result of FIGS. 13A to 15B, for ease of understanding, the center voltage of the control voltage is 0V.

In the first variable capacitance part 201, composite capacitance of capacitance (other capacitance 211) excluding the varactor 21A (corresponding to a first variable capacitance element according to the invention) is referred to as first composite capacitance. In the second variable capacitance part 202, composite capacitance of capacitance (other capacitance 213) excluding the varactor 22A (corresponding to a second variable capacitance element according to the invention) is referred to as second composite capacitance.

In the simulation, it is assumed that the relationship of the first composite capacitance<the second composite capacitance is established. Here, even though capacitance of the varactor 21B and the varactor 22B fluctuates, capacitance is handled as fixed capacitance and calculated using the maximum value and the minimum value, such that the relationship of the first composite capacitance<the second composite capacitance is satisfied.

In the example of FIGS. 7A and 7B, a frequency deviation characteristic in which the slope is the same on the left and right sides (negative side and positive side) of the center voltage of the control voltage is obtained. However, the oscillation circuit 13 which forms a part of the TCXO includes the varactor 21B and the varactor 22B for external control in addition to the varactor 21A and the varactor 22A for temperature compensation. For this reason, since there are a plurality of varactors which are controlled with different reference voltages, in general, linearity of a frequency control characteristic is deteriorated.

As described referring to FIG. 5, the size of the varactor 21A significantly affects the slope on the negative side of the control voltage, and the size of the varactor 22A significantly affects the slope on the positive side of the control voltage. In the simulation, it is necessary to examine whether or not the slope of the frequency control characteristic is the same on the left and right sides of the center voltage of the control voltage, that is, whether or not sensitivity is flat.

1.5.3. Simulation Result

FIGS. 13A to 15B show a simulation result for selecting the size of the varactors 21A and 22A of the oscillation circuit 13. In FIGS. 13A to 15B, the same elements as those in FIGS. 7A and 7B are represented by the same reference numerals, and descriptions thereof will not be repeated.

Figure 13A:
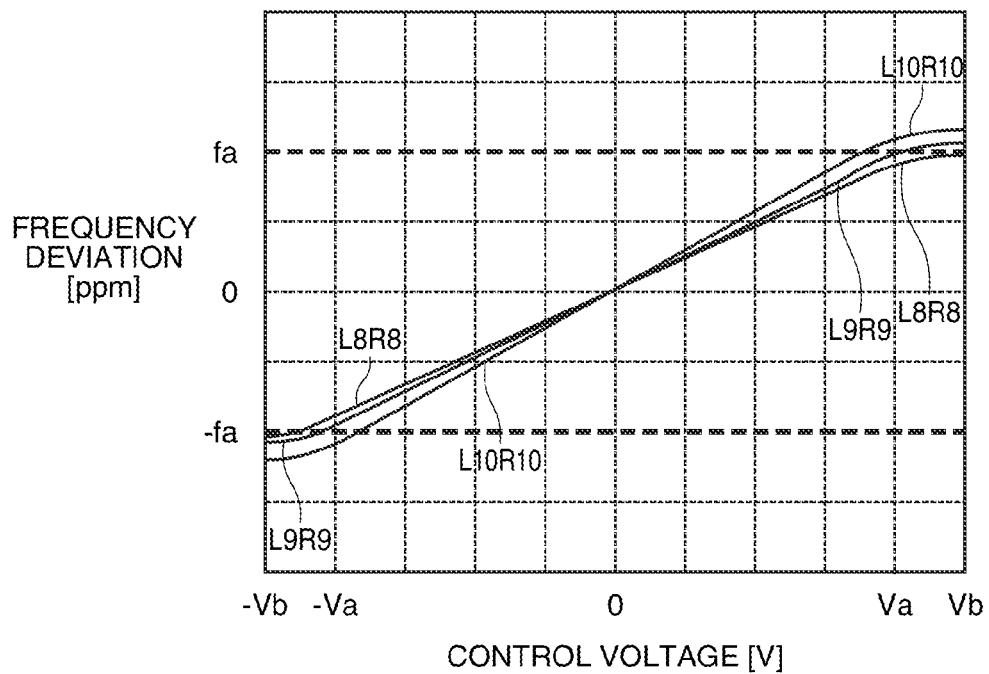
FIGS. 13A and 13B are diagrams illustrating a simulation result when variable capacitance elements on an input side and an output side are of same size.
Figure 13B:
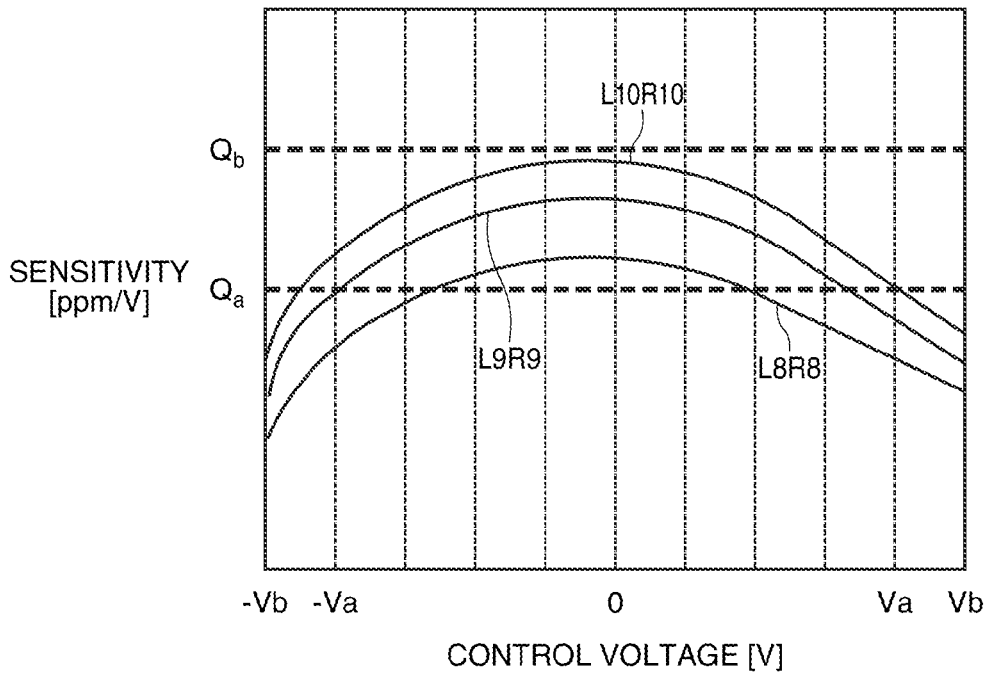

FIGS. 13A and 13B are diagrams showing a simulation result when the varactor 21A and the varactor 22A are of same size. For example, a curve L8R8 of FIG. 13A represents a frequency deviation characteristic when the varactor 21A on the left side of FIG. 12 is a varactor of size corresponding to eight times greater than basic size, and the varactor 22A on the right side is a varactor of size corresponding to eight times greater than basic size. Similarly, a curve L9R9 and a curve L10R10 represent a frequency deviation characteristic when the varactor 21A and the varactor 22A are respectively varactors of size corresponding to nine times and ten times greater than basic size.

It is confirmed that, when converting these curves to sensitivity, the maximum value of sensitivity is equal to or greater than the lower limit sensitivity Qa and equal to or smaller than the upper limit sensitivity Qb representing allowable phase noise. Then, as in FIG. 13B, the maximum values of the curve L8R8, the curve L9R9, and the curve L10R10 are equal to or greater than the lower limit sensitivity Qa and equal to or smaller than the upper limit sensitivity Qb. However, it cannot be said that these curves representing the sensitivity characteristics are flat.

Of the simulation conditions, the condition of the first composite capacitance<the second composite capacitance having a significant effect is considered. Even though the control voltage changes by the same amount, the magnitude of the effect on the first variable capacitance part 201 by the varactor 21A is different from the magnitude of the effect on the second variable capacitance part 202 by the varactor 22A. That is, when the varactor 21A and the varactor 22A are of same size, the effect on the overall composite capacitance on the output side of the oscillation circuit 13 by the varactor 22A is smaller than the effect on the overall composite capacitance on the input side by the varactor 21A.

For this reason, in order to make a curve representing a sensitivity characteristic flat, it is necessary to examine the ratio in size of the varactor 21A and the varactor 22A.

Figure 14A:
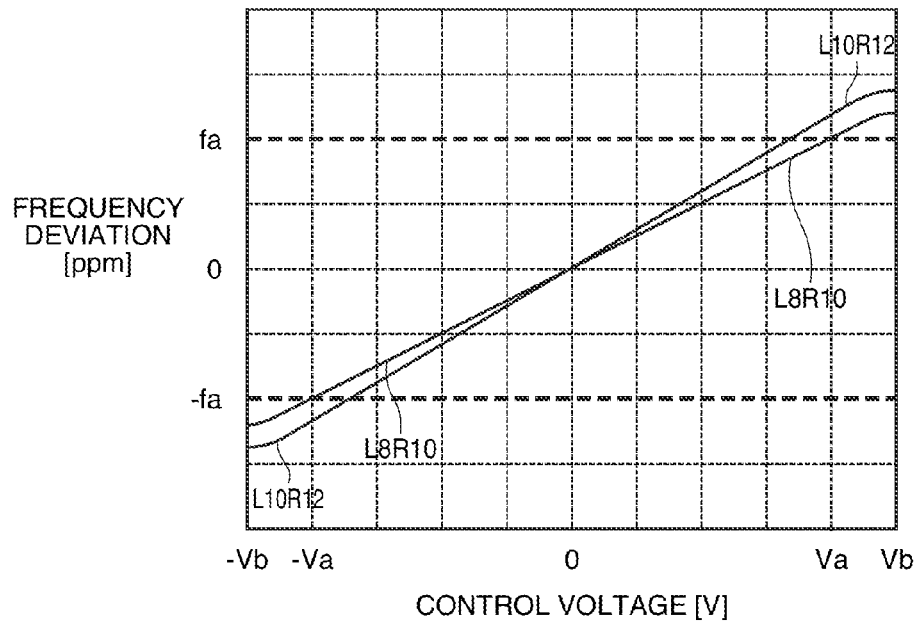
FIGS. 14A and 14B are diagrams illustrating a simulation result when a variable capacitance element on an output side is of larger size compared to an input side.
Figure 14B:
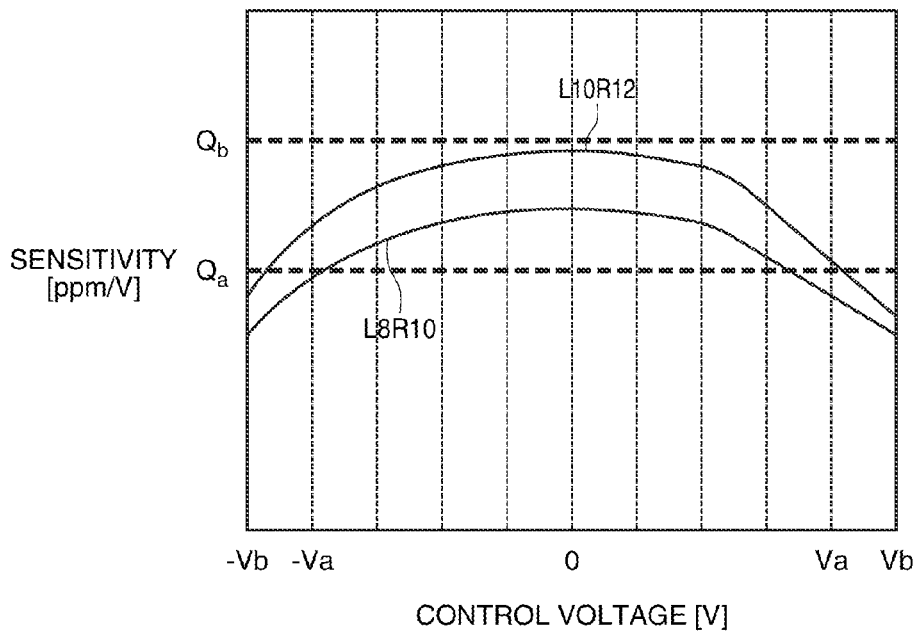

FIGS. 14A and 14B are diagrams illustrating a simulation result when the size of the varactor 21A is smaller than the size of the varactor 22A. For example, a curve L8R10 of FIG. 14A represents a frequency deviation characteristic when the varactor 21A is a varactor of size corresponding to eight times greater than basic size and the varactor 22A is a varactor of size corresponding to ten times greater than basic size. Similarly, a curve L10R12 represents a frequency deviation characteristic when the varactor 21A is a varactor of size corresponding to ten times greater than basic size and the varactor 22A is a varactor of size corresponding to 12 times greater than basic size.

It is confirmed that, when these curves are converted to sensitivity, whether the maximum value of sensitivity is equal to or greater than the lower limit sensitivity Qa and equal to or smaller than the upper limit sensitivity Qb representing allowable phase noise. Then, as in FIG. 14B, the maximum values of the curve L8R10 and the curve L10R12 are equal to or greater than the lower limit sensitivity Qa and equal to or smaller than the upper limit sensitivity Qb. It can be said that these curves representing sensitivity characteristics are flat compared to FIG. 13B.

This is considered because the size of the varactor 21A is smaller than the size of the varactor 22A from the relationship of the first composite capacitance<the second composite capacitance, the effect on the overall composite capacitance on the output side of the oscillation circuit 13 by the varactor 22A is substantially the same as the effect on the overall composite capacitance on the input side by the varactor 21A, and sensitivity is constant.

Figure 15A:
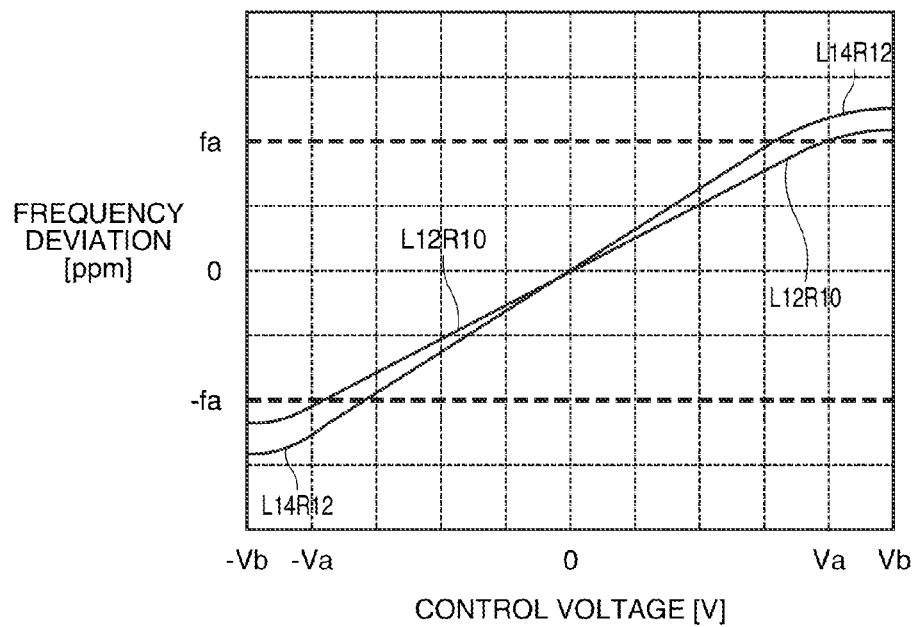
FIGS. 15A and 15B are diagrams illustrating a simulation result when a variable capacitance element on an input side is of larger size compared to an output side.
Figure 15B:
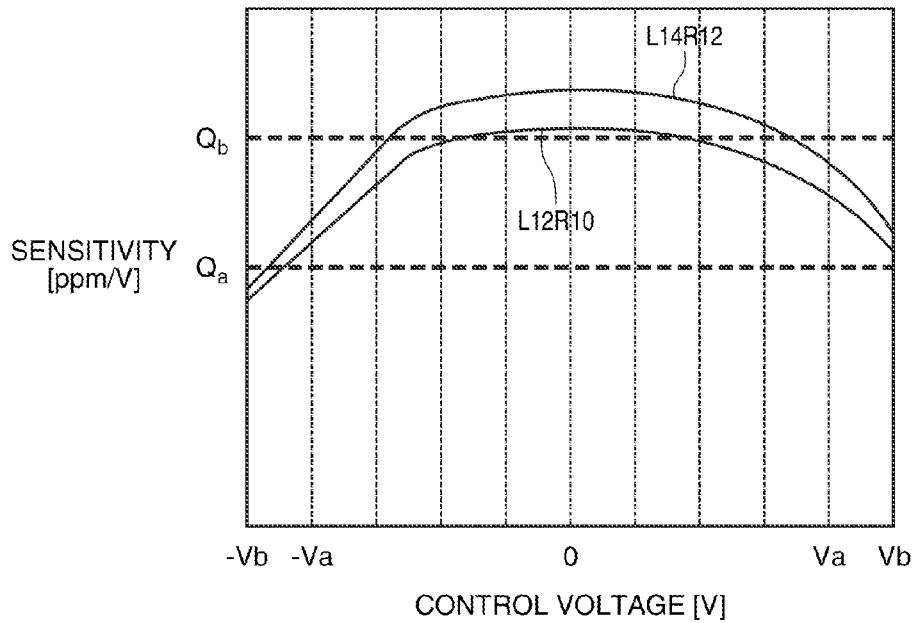

FIGS. 15A and 15B are diagrams showing a result of a simulation for confirmation when the size of the varactor 21A is greater than the size of the varactor 22A. A curve L12R10 represents a frequency deviation characteristic when the varactor 21A is a varactor of size corresponding 12 times greater than basic size, and the varactor 22A is a varactor of size corresponding to ten times greater than basic size. A curve L14R12 represents a frequency deviation characteristic when the varactor 21A is a varactor of size corresponding to 14 times greater than basic size, and the varactor 22A is a varactor of size corresponding to 12 times greater than basic size.

At this time, even when comparing with FIG. 13A or 14A, the slope of the frequency deviation characteristic is large. With conversion in terms of sensitivity, as in FIG. 15B, it is confirmed that all curves exceed the upper limit sensitivity Qb. Accordingly, when the first composite capacitance<the second composite capacitance, it can be said that it is not appropriate to make the size of the varactor 21A greater than the size of the varactor 22A.

1.5.4. Consideration for Selection of Size of Varactor

Taking into consideration from the simulation results of FIGS. 13A to 15B, the size of the varactors 21A and 22A of the oscillation circuit 13 may be selected in the following manner. When the second composite capacitance (composite capacitance of other capacitance 213) is greater than the first composite capacitance (composite capacitance of other capacitance 211), the size of the varactor 22A is greater than the size of the varactor 21A. Conversely, when the first composite capacitance is greater than the second composite capacitance, the size of the varactor 21A is greater than the size of the varactor 22A.

That is, the magnitude of the size of the varactors 21A and 22A may conform to the magnitude of the first composite capacitance and the second composite capacitance.

In regard to the varactors 21A and 22A, although it is assumed that there is a varactor of basic size (once), no basic size may be defined and the magnitude may be compared with capacitance. At this time, since capacitance of the varactors 21A and 22A fluctuates with the first control voltage $V_{C1}$, the magnitude may be compared with capacitance when a reference potential difference is given. The reference potential difference means a predetermined potential difference (for example, 0 V) which is given after a predetermined terminal (for example, a back-gate terminal or when the polarity of a varactor is inverted, a gate terminal) of each of the varactors 21A and 22A reaches a predetermined voltage (for example, a ground potential).

Here, referring to FIG. 14B, the upper limit value of the varactor 22A when the first composite capacitance<the second composite capacitance is taken into consideration. The lower limit value is the size of the varactor 21A. As shown in FIG. 14B, of the combinations in which the maximum value when converting to sensitivity is equal to or greater than the lower limit sensitivity Qa and equal to or smaller than the upper limit sensitivity Qb, the varactors 21A and 22A are selected, thereby performing appropriate sensitivity design. However, if there is no upper limit value of the varactor 22A, since there are too many combinations as candidates, it is not possible to perform efficient design.

Examination is performed using other simulation results which are not shown in FIG. 14B, and it is understood that, when the ratio in size of the varactor 21A and the varactor 22A is substantially the same as the ratio of the first composite capacitance and the second composite capacitance, a satisfactory result is obtained. In the simulation, when capacitance of the varactor 22A is about 1.2 times greater than that of the varactor 21A, as shown in FIG. 14B, a satisfactory result is obtained.

In general, in designing the oscillation circuit 13, it is not designed such that composite capacitance on the input side is significantly biased with respect to composite capacitance on the output side. For this reason, in practical design, it is considered that the second composite capacitance is within 1.5 times greater than the first composite capacitance.

Then, it can be said that there is no need for taking into consideration a case where the size of the varactor 22A is equal to or greater than 1.5 times greater than the size of the varactor 21A. That is, from the viewpoint of efficiency of design, it is preferable that the upper limit value of the varactor 22A is 1.5 times greater than the size of the varactor 21A.

From above, for efficient design, the range of the size of the varactors 21A and 22A of the oscillation circuit 13 may be narrowed as follows. When the second composite capacitance (composite capacitance of other capacitance 213) is greater than the first composite capacitance (composite capacitance of other capacitance 211), the size of the varactor 22A is equal to or smaller than 1.5 times greater than the size of the varactor 21A. Conversely, when the first composite capacitance is greater than the second composite capacitance, the size of the varactor 21A is equal to or smaller than 1.5 times greater than the size of the varactor 22A.

In this case, no basic size may be determined, and the magnitude may be compared with capacitance of the varactors 21A and 22A based on the reference potential difference.

As described above, the oscillation circuit 13 gives different potential differences to the varactors 21A and 22A, thereby expanding a variable width after combination. At this time, since no level shift circuit is required, it is possible to suppress an increase in circuit scale and power consumption. The magnitude of the size of the varactors 21A and 22A conforms to the magnitude of the first composite capacitance and the second composite capacitance. Accordingly, since it is possible to make the amount of change of the first variable capacitance part 201 with respect to the first control voltage $V_{C1}$ conform to the amount of change of the second variable capacitance part 202, linearity becomes satisfactory, and an appropriate sensitivity characteristic is obtained.

2. Vibrating Device

A vibrating device of this embodiment includes a voltage-controlled oscillation circuit, and an resonator element (vibrating body) which oscillates by the oscillation circuit. In describing the vibrating device of this embodiment, the voltage-controlled oscillation circuit corresponds to the oscillation circuit 13 (the oscillation circuit 12 of FIG. 1) including the amplification circuit 224. As a vibrating device, for example, an oscillator including a vibrator as an resonator element, a physical quantity sensor including a vibrating sensing element as an resonator element, or the like may be exemplified.

Figure 16A:
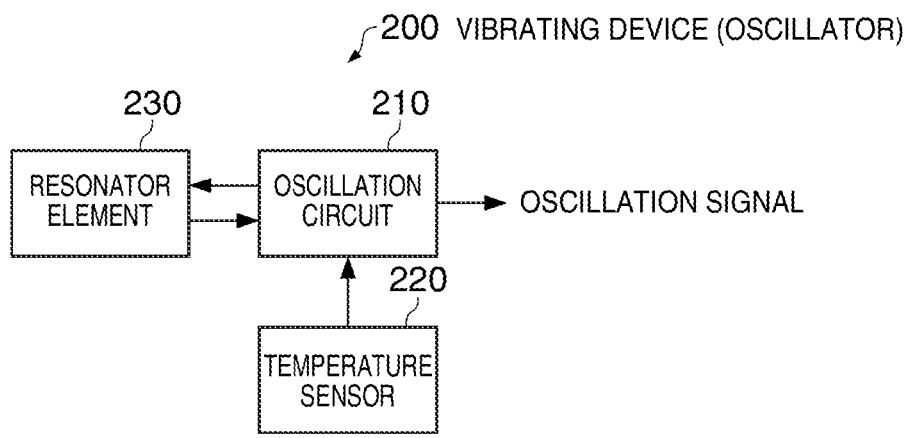
FIGS. 16A and 16B are diagrams showing a configuration example of a vibrating device.

FIG. 16A shows a configuration example of an oscillator which is an example of a vibrating device. A vibrating device 200 (oscillator) shown in FIG. 16A is a temperature compensated oscillator which includes an oscillation circuit 210, a temperature sensor 220, and an resonator element 230, such as a crystal resonator.

The oscillation circuit 210 generates a frequency control voltage Vc according to an output signal of the temperature sensor 220 therein, changes the capacitance value of a variable capacitance element according to change in temperature, and oscillates the resonator element 230 (corresponding to the resonator element 226 of FIG. 1) at a given frequency while compensating for a frequency-temperature characteristic of the resonator element 230. As the oscillation circuit 210, the oscillation circuit 13 (corresponding to the oscillation circuit 12 of FIG. 1) including the amplification circuit 224 may be applied.

As an oscillator which is the vibrating device of this embodiment, in addition to a temperature compensated oscillator, there are a voltage controlled oscillator (VCXO, VCSO, or the like), a voltage controlled temperature compensated oscillator (VC-TCXO), a constant temperature oscillator (OCXO or the like), and the like. This oscillator may be a piezoelectric oscillator (crystal oscillator or the like), a SAW oscillator, a silicon oscillator, an atomic oscillator, or the like without depending on the material of the resonator element or excitation means.

Figure 16B:
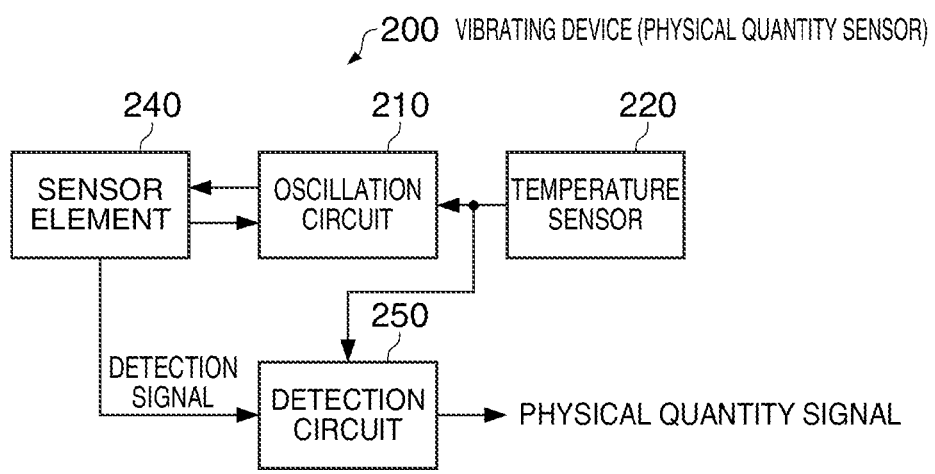

FIG. 16B shows a configuration example of a physical quantity sensor which is an example of a vibrating device. A vibrating device 200 (physical quantity sensor) shown in FIG. 16B includes an oscillation circuit 210, a temperature sensor 220, a sensor element 240 made of crystal or the like, and a detection circuit 250.

The oscillation circuit 210 generates a frequency control voltage Vc according to an output signal of the temperature sensor 220 therein, changes the capacitance value of a variable capacitance element according to change in temperature, and oscillates the sensor element 240 at a given frequency while compensating for a frequency-temperature characteristic of the sensor element 240. As the oscillation circuit 210, the oscillation circuit 13 (corresponding to the oscillation circuit 12 of FIG. 1) including the amplification circuit 224 may be applied.

The sensor element 240 outputs a detection signal according to the magnitude of an applied physical quantity (for example, acceleration, angular velocity, or the like) while vibrating at a given frequency.

The detection circuit 250 detects the detection signal of the sensor element 240 or converts the detection signal to a direct current, generates a physical sensor signal at a signal level according to the magnitude of a physical quantity applied to the sensor element 240, and outputs the physical sensor signal. The detection circuit 250 may compensate for a temperature characteristic of a circuit element or a temperature characteristic of the sensor element 240 according to an output signal of the temperature sensor 220, and may adjust the vibration level of the physical quantity signal.

As a physical sensor which is the vibrating device of this embodiment, an angular velocity sensor (gyro sensor), an acceleration sensor, or the like may be exemplified.

According to this embodiment, it is possible to provide the vibrating device 200 capable of obtaining an appropriate sensitivity characteristic of a variable capacitance element while expanding a variable width of a variable capacitance element and suppressing an increase in circuit scale and power consumption by the oscillation circuit 210, and achieving user-friendliness.

3. Electronic Apparatus

An electronic apparatus 300 of this embodiment will be described referring to FIGS. 17 to 18. The same elements as those in FIGS. 1 to 16 are represented by the same reference numerals, and description thereof will not be repeated.

Figure 17:
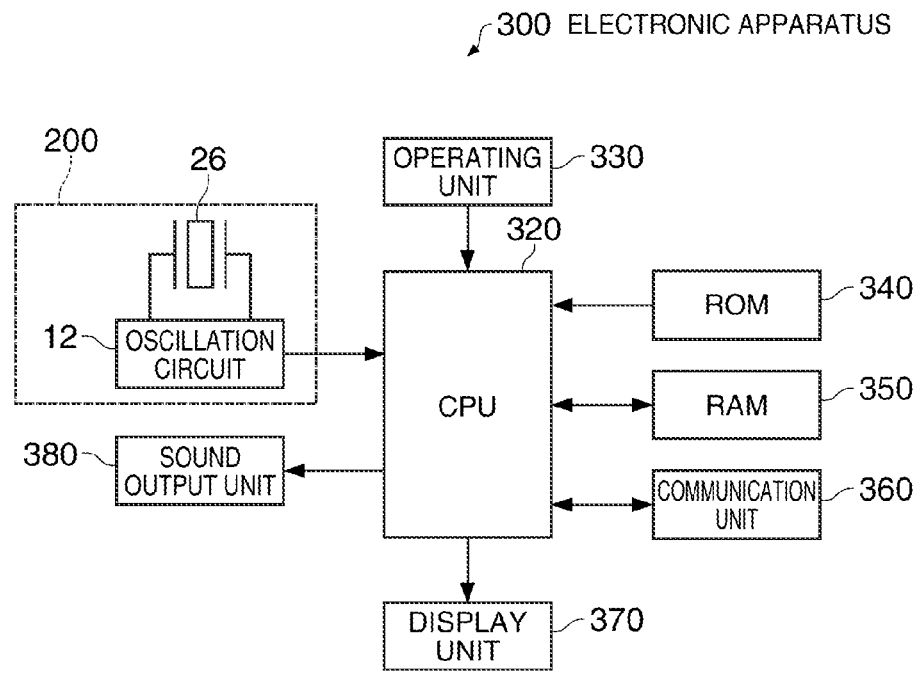
FIG. 17 is a functional block diagram of an electronic apparatus.

FIG. 17 is a functional block diagram of the electronic apparatus 300. The electronic apparatus 300 includes a vibrating device 200 including an oscillation circuit 12 and a crystal vibrator 26, a central processing unit (CPU) 320, an operating unit 330, a read only memory (ROM) 340, a random access memory (RAM) 350, a communication unit 360, a display unit 370, and a sound output unit 380. In the electronic apparatus 300, some of the constituent elements (respective units) of FIG. 17 may be omitted or changed, or other constituent elements may be added.

The vibrating device 200 supplies a clock pulse to the respective units as well as the CPU 320 (not shown). The vibrating device 200 may be an oscillator in which the oscillation circuit 12 and the crystal vibrator 26 are packaged as a single body.

The CPU 320 performs various kinds of computation processing or control processing using the clock pulse output from the oscillation circuit 13 in accordance with a program stored in the ROM 340 or the like. Specifically, the CPU 320 performs various kinds of processing according to an operation signal from the operating unit 330, processing for controlling the communication unit 360 so as to perform data communication with the outside, processing for transmitting a display signal so as to display various kinds of information on the display unit 370, processing for outputting various kinds of sound from the sound output unit 380, and the like.

The operating unit 330 is an input device which has operating keys, button switches, or the like, and outputs an operation signal according to user's operation to the CPU 320.

The ROM 340 stores a program for performing various kinds of computation processing or control processing in the CPU 320, data, and the like.

The RAM 350 is used as a work area of the CPU 320, and temporarily stores the program or data read from the ROM 340, data input from the operating unit 330, computation results executed by the CPU 320 in accordance with various programs, and the like.

The communication unit 360 performs various kinds of control to establish data communication between the CPU 320 and an external device.

The display unit 370 is a display device which has a liquid crystal display (LCD) or the like, and displays various kinds of information on the basis of a display signal input from the CPU 320.

The sound output unit 380 is a device, such as a speaker, which outputs output sound.

As described above, in the oscillation circuit 12 of the vibrating device 200, it is possible to expand a variable width of a variable capacitance element while securing linearity, and to suppress an increase in circuit scale and power consumption. For this reason, the electronic apparatus 300 can obtain a clock pulse having a necessary frequency variable width. It is also possible to realize the electronic apparatus 300 which is compact and has low power consumption.

As the electronic apparatus 300, various electronic apparatuses are considered. For example, a personal computer (for example, a mobile personal computer, a laptop personal computer, or a tablet personal computer), a moving object terminal, such as a mobile phone, a digital still camera, an ink jet ejection apparatus (for example, an ink jet printer), a storage area network instrument, such as a router or a switch, a local area network instrument, a television, a video camera, a video tape recorder, a car navigation system, a pager, an electronic organizer (including one with a communication function), an electronic dictionary, an electronic calculator, an electronic game machine, a game controller, a word processor, a work station, a video phone, a security television monitor, electronic binoculars, a POS terminal, a medical instrument (for example, an electronic thermometer, a sphygmomanometer, a blood glucose meter, an electrocardiographic measurement apparatus, an ultrasonic diagnosis apparatus, or an electronic endoscope), a fish finder, various measurement instruments, meters (for example, meters of a vehicle, an aircraft, and a vessel), a flight simulator, a head-mounted display, motion trace, motion tracking, a motion controller, pedestrian dead reckoning (PDR), and the like may be exemplified.

Figure 18:
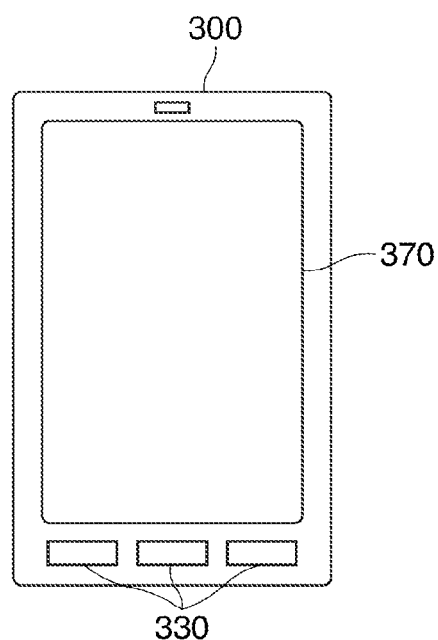
FIG. 18 is a diagram showing an example of the appearance of an electronic apparatus.

FIG. 18 is a diagram showing an example of the appearance of a smart phone which is an example of the electronic apparatus 300. The smart phone as the electronic apparatus 300 includes buttons as the operating unit 330 and an LCD as the display unit 370. The smart phone as the electronic apparatus 300 uses the vibrating device 200 including the oscillation circuit 12, thereby achieving compactness and suppressed power consumption.

4. Moving Object

A moving object 400 of this embodiment will be described referring to FIG. 19.

Figure 19:
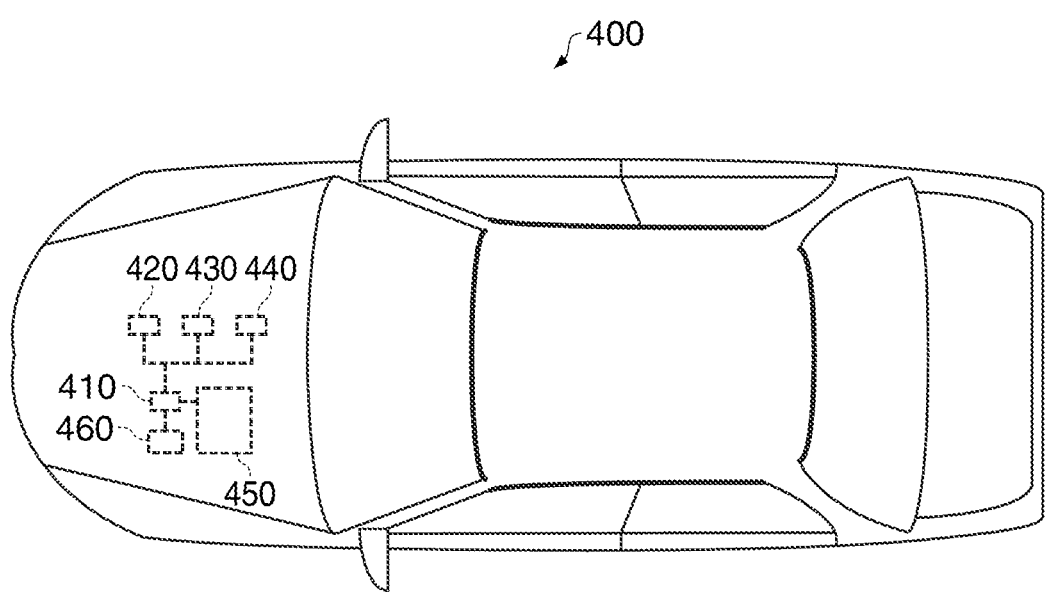
FIG. 19 is a diagram showing an example of a moving object.

FIG. 19 is a diagram (top view) showing an example of a moving object of this embodiment. A moving object 400 shown in FIG. 19 includes an oscillation circuit 410, controllers 420, 430, and 440 which perform various kinds of control of an engine system, a brake system, a keyless entry system, and the like, a battery 450, and a backup battery 460. In the moving object of this embodiment, some of the constituent elements (respective units) of FIG. 19 may be omitted or changed, or other constituent elements may be added.

The oscillation circuit 410 may be, for example, the oscillation circuit 13 or the oscillation circuit 12, or may be substituted with the vibrating device 200 (oscillator). While detailed descriptions of other constituent elements are omitted, high reliability is required so as to perform control necessary for movement of the moving object. For example, in addition to the battery 450, the backup battery 460 is provided so as to increase reliability.

A clock pulse output from the oscillation circuit 410 should have a predetermined frequency without depending on environmental change, such as temperature.

At this time, in the oscillation circuit 410, it is possible to expand a variable width of a variable capacitance element while securing linearity, and to suppress an increase in circuit scale and power consumption. For this reason, the system of the moving object 400 of this application example can obtain a clock pulse having a frequency variable width capable of coping with environmental change, such as temperature, from the oscillation circuit 410. For this reason, it is possible to secure reliability and to avoid an increase in size or power consumption.

As the moving object 400, various moving objects are considered, and for example, a vehicle (including an electric vehicle), an aircraft, such as a jet aircraft or a helicopter, a vessel, a rocket, an artificial satellite, or the like may be exemplified.

5. Others

The invention substantially includes the same configuration (for example, a configuration having the same functions, methods, and results, or a configuration having the same objects and effects) as the configuration described in the foregoing embodiment. The invention includes a configuration in which a non-essential portion of the configuration described in the embodiment is substituted. The invention includes a configuration in which the same functional effects as the configuration described in the embodiment can be obtained or the same objects can be attained. The invention includes a configuration in which the known technique is added to the configuration described in the embodiment.

The entire disclosure of Japanese Patent Application No. 2012-216376, filed Sep. 28, 2012 is expressly incorporated by reference herein.

What is claimed is:

1. An oscillation circuit which is connected to an amplification circuit and oscillates a resonator element to output an oscillation signal, comprising:
   a first variable capacitance part which includes a first variable capacitance element whose capacitance is controlled on the basis of a potential difference between a first control voltage and a first reference voltage, and is connected to an input side of the amplification circuit; and
   a second variable capacitance part which includes a second variable capacitance element whose capacitance is controlled on the basis of a potential difference between the first control voltage and a second reference voltage, and is connected to an output side of the amplification circuit,
   wherein, a composite capacitance in the first variable capacitance part excluding the first variable capacitance element is a first composite capacitance, and a composite capacitance in the second variable capacitance part excluding the second variable capacitance element is a second composite capacitance,
   if the second composite capacitance is greater than the first composite capacitance, when comparing with capacitance based on a reference potential difference, a capacitance of the second variable capacitance element is set to be greater than a capacitance of the first variable capacitance element, and
   if the first composite capacitance is greater than the second composite capacitance, when comparing with capacitance based on the reference potential difference, the capacitance of the first variable capacitance element is greater than the capacitance of the second variable capacitance element.

2. The oscillation circuit according to claim 1,
   wherein, if the second composite capacitance is greater than the first composite capacitance, when comparing with capacitance based on the reference potential difference, the capacitance of the second variable capacitance element is equal to or smaller than 1.5 times greater than the capacitance of the first variable capacitance element, and
   if the first composite capacitance is greater than the second composite capacitance, when comparing with capacitance based on the reference potential difference, the capacitance of the first variable capacitance element is equal to or smaller than 1.5 times greater than the capacitance of the second variable capacitance element.

3. The oscillation circuit according to claim 1,
   wherein at least one of the first variable capacitance part and the second variable capacitance part includes a variable capacitance element whose capacitance is controlled by a control voltage different from the first control voltage.

4. A semiconductor integrated circuit device comprising:
   the oscillation circuit according to claim 1.

5. A semiconductor integrated circuit device comprising:
   the oscillation circuit according to claim 2.

6. The semiconductor integrated circuit device according to claim 4, further comprising:
   the amplification circuit.

7. The semiconductor integrated circuit device according to claim 5, further comprising:
   the amplification circuit.

8. A vibrating device comprising:
   the oscillation circuit according to claim 1;
   the amplification circuit; and
   the resonator element.

9. A vibrating device comprising:
   the oscillation circuit according to claim 2;
   the amplification circuit; and
   the resonator element.

10. An electronic apparatus comprising:
    the oscillation circuit according to claim 1.

11. An electronic apparatus comprising:
    the oscillation circuit according to claim 2.

12. A moving object comprising:
    the oscillation circuit according to claim 1.

13. A moving object comprising:
    the oscillation circuit according to claim 2.

* * * * *